(12) United States Patent
Cha et al.

(10) Patent No.: US 9,972,371 B2
(45) Date of Patent: May 15, 2018

(54) MEMORY DEVICE INCLUDING MEMORY CELL FOR GENERATING REFERENCE VOLTAGE

(71) Applicant: SAMSUNG ELECTRONICS CO., LTD., Suwon-si, Gyeonggi-Do (KR)

(72) Inventors: Soo-Ho Cha, Seoul (KR); Chankyung Kim, Hwaseong-si (KR); Sungchul Park, Seoul (KR); Hoyoung Song, Hwaseong-si (KR); Kwangchol Choe, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days. days.

(21) Appl. No.: 15/596,558

(22) Filed: May 16, 2017

(65) Prior Publication Data

US 2017/0365308 A1 Dec. 21, 2017

(30) Foreign Application Priority Data

Jun. 20, 2016 (KR) ........................ 10-2016-0076693

(51) Int. Cl.
*G11C 7/12* (2006.01)
*G11C 7/06* (2006.01)
*G11C 7/22* (2006.01)
*G11C 7/14* (2006.01)

(52) U.S. Cl.
CPC ................ *G11C 7/12* (2013.01); *G11C 7/062* (2013.01); *G11C 7/14* (2013.01); *G11C 7/22* (2013.01)

(58) Field of Classification Search
CPC .................................. G11C 7/12; G11C 7/14
See application file for complete search history.

(56) References Cited

U.S. PATENT DOCUMENTS

| | | | |
|---|---|---|---|
| 5,184,324 A | 2/1993 | Ohta | |
| 5,283,761 A | 2/1994 | Gillingham | |
| 5,450,363 A * | 9/1995 | Christopherson | ....... G11C 11/56 341/98 |
| 5,684,736 A | 11/1997 | Chan | |
| 5,917,748 A | 6/1999 | Chi et al. | |
| 6,097,620 A | 8/2000 | Naritake | |
| 6,137,739 A | 10/2000 | Kim | |
| 6,501,697 B1 * | 12/2002 | Perner | .................... G11C 7/062 365/148 |
| 6,850,447 B2 * | 2/2005 | Kang | .................. G11C 11/5657 365/145 |

(Continued)

*Primary Examiner* — Hoai V Ho
*Assistant Examiner* — Jay Radke
(74) *Attorney, Agent, or Firm* — F. Chau & Associates, LLC

(57) ABSTRACT

A memory device includes a first memory cell, a second memory cell, a third memory cell, a bitline sense amplifier, and a switch circuit. The first memory cell is connected to a first wordline and a first bitline. The second memory cell is connected to the first wordline and a second bitline. The third memory cell is connected to the first wordline and a third bitline. The bitline sense amplifier is connected to the third bitline. The switch circuit is connected to the first bitline, the second bitline, and the bitline sense amplifier. The switch circuit performs charge sharing between the first memory cell and the first bitline to generate a first reference voltage, and charge sharing between the second memory cell and the second bitline to generate a second reference voltage.

20 Claims, 15 Drawing Sheets

(56) References Cited

U.S. PATENT DOCUMENTS

| | | | |
|---|---|---|---|
| 7,009,880 B1* | 3/2006 | Liu | G11C 16/26 365/185.11 |
| 7,099,202 B1* | 8/2006 | Son | G11C 7/10 365/189.02 |
| 7,133,311 B2 | 11/2006 | Liu | |
| 7,551,489 B2 | 6/2009 | Tedrow et al. | |
| 7,557,452 B1 | 7/2009 | Song et al. | |
| 7,609,546 B2 | 10/2009 | Rao | |
| 8,189,357 B2* | 5/2012 | Ho | G11C 7/04 365/2 |
| 8,773,925 B2 | 7/2014 | Koya et al. | |
| 2002/0053007 A1* | 5/2002 | Birk | G11C 11/565 711/149 |
| 2002/0181284 A1* | 12/2002 | Kato | B82Y 10/00 365/185.21 |
| 2002/0186590 A1* | 12/2002 | Lee | G11C 5/025 365/185.17 |
| 2004/0196696 A1* | 10/2004 | Yamauchi | G11C 16/28 365/185.2 |
| 2006/0120133 A1* | 6/2006 | Star Sung | G11C 11/5692 365/94 |
| 2007/0139994 A1* | 6/2007 | Song | G11C 11/24 365/149 |
| 2007/0195619 A1* | 8/2007 | Rhie | G11C 7/18 365/200 |
| 2008/0025103 A1* | 1/2008 | Dudeck | G11C 7/062 365/185.25 |
| 2010/0118588 A1* | 5/2010 | Chen | G11C 5/147 365/148 |
| 2011/0211410 A1* | 9/2011 | Kim | G11C 11/4097 365/210.1 |

* cited by examiner

US 9,972,371 B2

MEMORY DEVICE INCLUDING MEMORY CELL FOR GENERATING REFERENCE VOLTAGE

CROSS-REFERENCE TO RELATED APPLICATIONS

This U.S. non-provisional patent application claims priority under 35 USC § 119 to Korean Patent Application No. 10-2016-0076693, filed on Jun. 20, 2016, the disclosure of which is incorporated by reference in its entirety herein.

BACKGROUND

1. Technical Field

Exemplary embodiments of the inventive concepts relate generally to memory devices and, more particularly, to a memory device to generate a reference voltage.

2. Discussion of Related Art

In general, memory devices are classified into volatile memory devices and nonvolatile memory devices. Volatile memory devices have higher read and write speeds than nonvolatile memory devices. Volatile memory devices may include a dynamic random access memory (DRAM) and a static random access memory (SRAM).

Memory devices have been widely used in mobile devices and other electronic devices such as desktop computers. Capacities of memory devices continue to increase with the advance in manufacturing process technology.

To implement a high-capacity memory device, two or more bits may be stored in a memory cell. Accordingly, a memory device capable of sensing a plurality of bits stored in a memory cell is required.

SUMMARY

At least one embodiment of the inventive concept relates to a memory device including a memory cell for generating a reference voltage.

A memory device according to an exemplary embodiment of the inventive concept includes a first memory cell, a second memory cell, a third memory cell, a bitline sense amplifier, and a switch circuit connected to the first bitline, the second bitline, and the bitline sense amplifier. The first memory cell is connected to a first wordline and a first bitline. The second memory cell is connected to the first wordline and a second bitline. The third memory cell is connected to the first wordline and a third bitline. The bitline sense amplifier is connected to the third bitline. The switch circuit performs charge sharing between the first memory cell and the first bitline to generate a first reference voltage, and performs charge sharing between the second memory cell and the second bitline to generate a second reference voltage.

A memory device according to an exemplary embodiment of the inventive concept includes a reference voltage generation circuit having a first memory cell coupled between a first wordline and a first bitline and a second memory cell coupled between the first wordline and a second bitline, a third memory cell connected to the first wordline and a third bitline, and a bitline sense amplifier connected to the third bitline. The reference voltage generation circuit generates a first reference voltage by performing charge sharing between the first memory cell and the first bitline and generates a second reference voltage by performing charge sharing between the second memory cell and the second bitline.

A memory device according to an exemplary embodiment of the inventive concept includes a controller configured to generate a first control signal and a second control signal, a first memory cell connected to a first wordline and a first bitline, a second memory cell connected to the first wordline and a second bitline, a third memory cell connected to the first wordline and a third bitline, a bitline sense amplifier connected to the third bitline, a first switch circuit configured to connect the first bitline to a first reference voltage line and the second bitline to a second reference voltage line in response to the first control signal, and a second switch circuit configured to connect one of the first and second reference voltage lines to the bitline sense amplifier in response to the second control signal.

DETAILED DESCRIPTION OF THE EXEMPLARY EMBODIMENTS

Hereinafter, exemplary embodiments of the inventive concept in conjunction with accompanying drawings will be described. Below, details, such as detailed configurations and structures, are provided to aid a reader in understanding embodiments of the inventive concept. Therefore, embodiments described herein may be variously changed or modified without departing from embodiments of the inventive concept.

Figure 1:
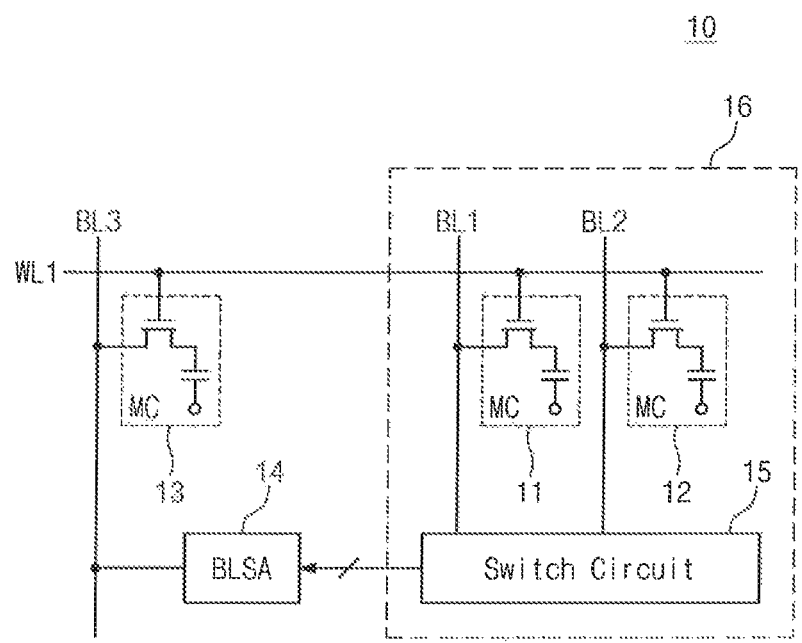
FIG. 1 is a block diagram of a memory device according to an exemplary embodiment of the inventive concept.

FIG. 1 is a block diagram of a memory device 10 according to an exemplary embodiment of the inventive concept. As illustrated, the memory device 10 includes a first memory cell 11, a second memory cell 12, a third memory cell 13, a bitline sense amplifier (BLSA) 14, and a switch circuit 15. A reference voltage generation circuit 16 includes the first memory cell 11, the second memory cell 12, and the switch circuit 15.

The first memory cell 11 is connected to a first wordline WL1 and a first bitline BL1. The first memory cell 11 may be a dynamic random access memory (DRAM) cell including one n-channel metal oxide semiconductor (NMOS) transistor and one capacitor. When the first wordline WL1 is applied with a high voltage, charge sharing may occur between the first memory cell 11 and the first bitline BL1. For example, application of the high voltage to gate terminals of transistors of the memory cells 11 and 12 causes these transistors to turn on and output voltages of capacitors within the memory cells to their respective bit lines.

The second memory cell 12 is connected to the first wordline WL1 and a second bitline BL2. The third memory cell 13 is connected to the first wordline WL1 and a third bitline BL3. Each of the second and third memory cells 12 and 13 may be implemented with the same structure as the first memory cell 11. A single bit of data, or two or more bits of data may be stored in the first to third memory cells 11 to 13.

The bitline sense amplifier 14 is connected to the third memory cell 13 through the third bitline BL3. The bitline sense amplifier 14 may receive a plurality of reference voltages or one of the plurality from the reference voltage generation circuit 16. The bitline sense amplifier 14 is configured to sense data stored in the third memory cell 13.

The reference voltage generation circuit 16 provides a plurality of reference voltages to the bitline sense amplifier 14. The reference voltage generation circuit 16 may generate a first reference voltage VREF1 (not shown) through charge sharing between the first memory cell 11 and the first bitline BL1. The reference voltage generation circuit 16 may generate a second reference voltage VREF2 (not shown) through charge sharing between the second memory cell 12 and the second bitline BL2. The reference voltage generation circuit 16 may transfer the first reference voltage VREF1 and the second reference voltage VREF2 to the bitline sense amplifier 14 through the switch circuit 15.

Unlike what is shown in FIG. 1, the reference voltage generation circuit 16 may include more than two memory cells and accordingly generate more than two reference voltages. The reference voltage generation circuit 16 may provide the plurality of reference voltages to components within the memory device 10 other than the bitline sense amplifier 14. According to an exemplary embodiment of the inventive concept, the memory device 10 generates reference voltages input to a bitline sense amplifier through charge sharing. Below, a reference voltage generation circuit will be described in detail.

Figure 2:
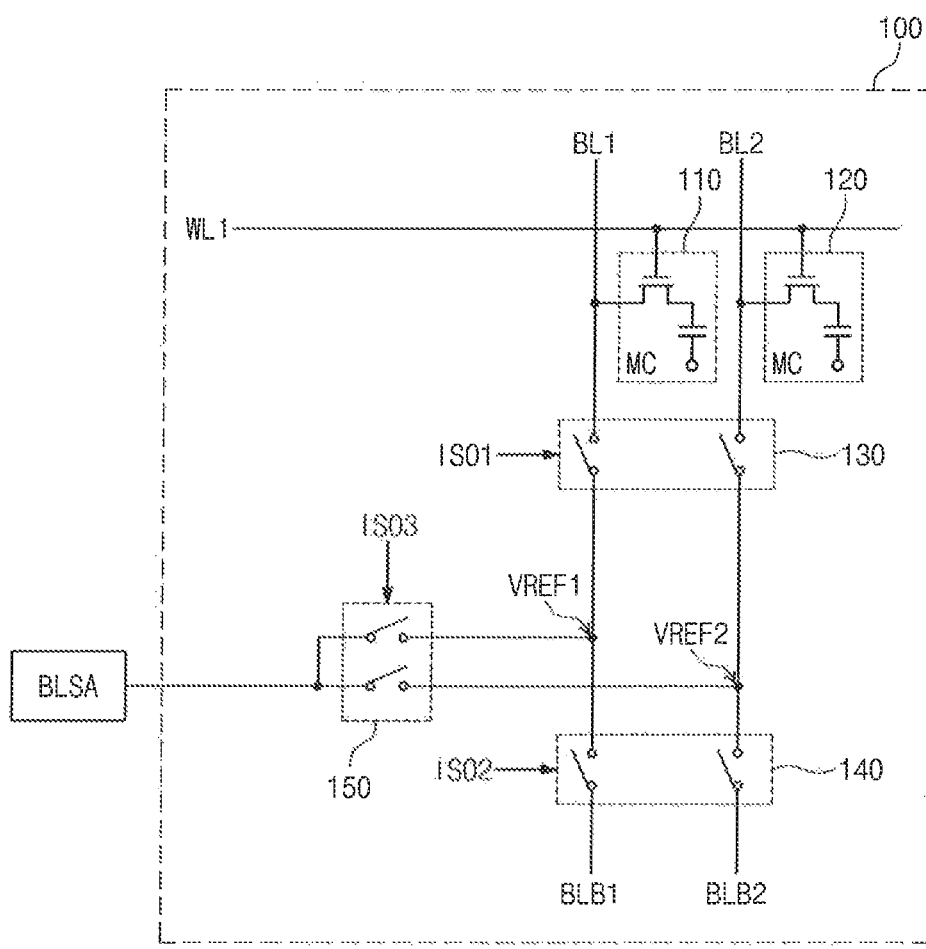
FIGS. 2 to 4 are block diagrams of reference voltage generation circuits according to exemplary embodiments of the inventive concepts, respectively.

FIG. 2 is a block diagram of a reference voltage generation circuit 100 according to an exemplary embodiment of the inventive concept that may be used to implement the reference voltage generation circuit 16 of FIG. 1. As illustrated, the reference voltage generation circuit 100 includes a first memory cell 110, a second memory cell 120, a first switch circuit 130, a second switch circuit 140, and a third switch circuit 150. The first memory cell 110 and the second memory cell 120 are identical/similar to those described in FIG. 1 and will not be described in detail.

Under the control of a first isolation signal ISO1, the first switch circuit 130 connects a first bitline BL1 with a first reference voltage line and connects a second bitline BL2 with a second reference voltage line. As shown in FIG. 2, the first switch circuit 130 includes two switches. For example, each switch may be implemented using one or both of an NMOS transistor and a p-channel metal oxide semiconductor (PMOS) transistor. For example, the two switches may either both be PMOS transistors or both be NMOS transistors so they are both turned on by the same signal (i.e., ISO1). The first isolation signal ISO1 may be generated by a row decoder that will be described later with reference to FIG. 15.

Under the control of a second isolation signal ISO2, the second switch circuit 140 connects a first bit bar line BLB1 (not necessarily a complement of the first bitline BL1) with the first reference voltage line and connects a second bit bar line BLB2 (not necessarily a complement of the second bitline BL2) with the second reference voltage line. As shown in FIG. 2, the second switch circuit 140 includes two switches. The second isolation signal ISO2 may be generated by the row decoder that will be described later with reference to FIG. 15.

When a first wordline WL1 is applied with a high voltage (e.g., VPP), an NMOS transistor of the first memory cell 110 is turned on. In this case, the first bitline BL1, the first bit bar line BLB1, and the first reference voltage line are connected by the first switch circuit 130 and the second switch circuit 140 or may be connected beforehand. When the NMOS transistor of the first memory cell 110 is turned on, charge sharing may occur among the first memory cell, the first bitline, and the first bit bar line BLB1.

In an embodiment, charges stored in a capacitor of the first memory cell 110 are distributed to the capacitor of the first memory cell 110, a capacitor (not shown) of the first bitline BL1, and a capacitor (not shown) of the first bit bar line BLB1. A voltage generated by the charge sharing may be used as a first reference voltage VREF1.

The second memory cell 120 may perform the same function as the first memory cell 110. Thus, when an NMOS transistor of the second memory cell 120 is turned on, charge sharing may occur among the second memory cell 120, the second bitline BL2, and the second bit bar line BLB2. A voltage generated by the charge sharing among the second memory cell 120, the second bitline BL2, and the second bit bar line BLB2 may be used as a second reference voltage VREF2. A voltage stored in the second memory cell 120 and a voltage stored in the first memory cell 110 may be different from each other. Thus, the second reference voltage VREF2 and the first reference voltage VREF1 generated by the charge sharing may also be different from each other.

Referring to FIG. 2, the first bitline BL1 and the first bit bar line BLB1 may be disposed at opposite sides of a bitline sense amplifier BLSA. Similarly, the second bitline BL2 and the second bit bar line BLB2 may be disposed at opposite sides of the bitline sense amplifier BLSA. This structure may be referred to as an open bitline structure. The open bitline structure may be applied to reduce an area of a memory device (not shown).

Under the control of a third isolation signal ISO3, the third switch circuit 150 connects one of the first and second reference voltage lines with the bitline sense amplifier BLSA. As shown in FIG. 2, the third switch circuit 150 includes two switches. In an embodiment, the two switches of the third circuit are switches of different logical types so that a same signal applied to control both switches can be used to keep no more than one of the two switches closed at a time.

The bitline sense amplifier BLSA may sense data stored in the third memory cell 13 (see FIG. 1) using the first reference voltage VREF1 or the second reference voltage VREF2. For example, two or more bits of data may be stored in the third memory cell 13. In an embodiment, the first reference voltage VREF1 is used when a most significant bit (MSB) of the third memory cell 13 is "1" and the second reference voltage VREF2 is used when the MSB of the third memory cell 13 is "0". The third isolation signal ISO3 may include MSB information. The process of sensing data of the third memory cell 13 will be described later with reference to FIGS. 7 to 10.

Figure 3:
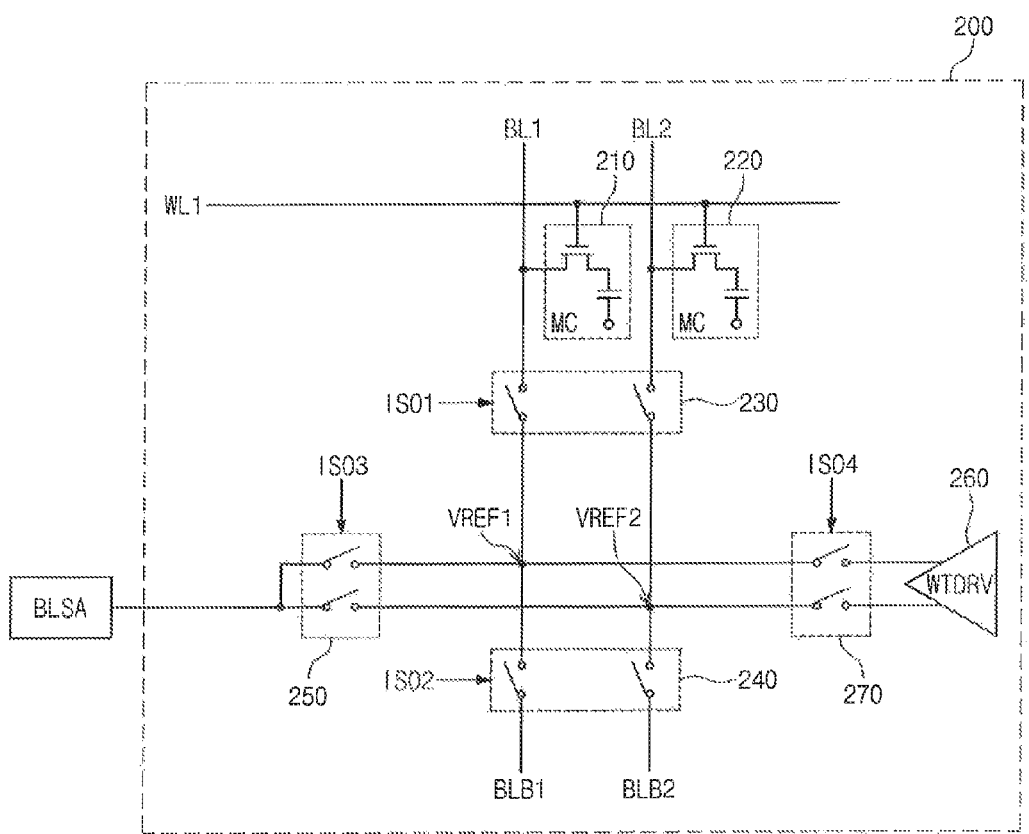

FIG. 3 is a block diagram of a reference voltage generation circuit 200 according to an exemplary embodiment of the inventive concept that may be used to implement the reference voltage generation circuit 16 of FIG. 1. As illustrated, the reference voltage generator 200 includes a first memory cell 210, a second memory cell 220, a first switch circuit 230, a second switch circuit 240, a third switch circuit 250, a write driver (WTDRV) 260, and a fourth switch circuit 270. The first memory cell 210, the second memory cell 220, the first switch circuit 230, the second switch circuit 240, and the third switch circuit 250 are identical/similar to those described in FIG. 2 and will not be described in detail.

The write driver 260 may write data into the first memory cell 210 and the second memory cell 220, respectively. The write driver 260 may transmit data to the first memory cell 210 through a first reference voltage line and a first bitline BL1. The write driver 260 may transmit data to the second memory cell 220 through a second reference voltage line and a second bitline BL2. At this point, the first wordline WL1 may be activated and the switches of the first switch circuit 230 may all be turned on.

The write driver 260 is illustrated in FIG. 3 as being included within the reference voltage generation circuit 200. However, in an alternate embodiment, the write driver 260 is included within an element of the memory device 10 (see FIG. 1) other than the reference voltage generation circuit 200 (or 16).

As described above, a first reference voltage VREF1 is generated by charge sharing among the first memory cell 210, the first bitline BL1, and the first bit bar line BLB1. A second reference voltage VREF2 is generated by charge sharing among the second memory cell 220, the second bitline BL2, and the second bit bar line BLB2. A capacitor voltage of the first memory cell 210 and a capacitor voltage of the second memory cell 220, which are generated by the write driver 260, may be determined by considering the charge sharing.

Under the control of a fourth isolation signal ISO4, the fourth switch circuit 270 may connect a first output of the write driver 260 to a first reference voltage line. Under the control of the fourth isolation signal ISO4, the fourth switch circuit 270 may connect a second output of the write driver 260 to a second reference voltage line. As shown in FIG. 3, the fourth switch circuit 270 includes two switches. The fourth isolation signal ISO4 may be generated by a row decoder that will be described with reference to FIG. 15.

Figure 4:
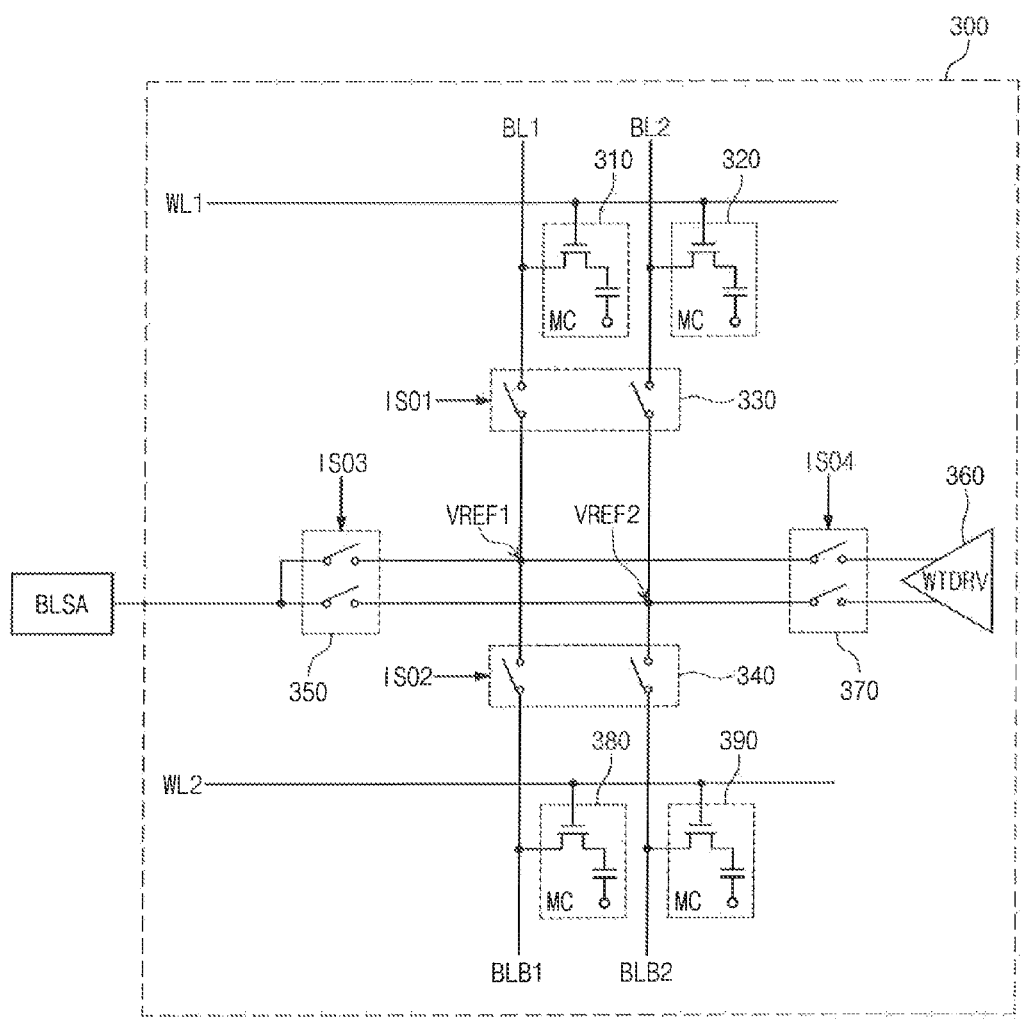

FIG. 4 is a block diagram of a reference voltage generation circuit 300 according to an exemplary embodiment of the inventive concept that may be used to implement the reference voltage generation circuit 16 of FIG. 1. As illustrated, the reference voltage generation circuit 300 includes a first memory cell 310, a second memory cell 320, a first switch circuit 330, a second switch circuit 340, a third switch circuit 350, a write driver 360, a fourth switch circuit 370, a third memory cell 380, and a fourth memory cell 390. Unlike the reference voltage generation circuit 200 in FIG. 3, the reference voltage generation circuit 300 further includes the third memory cell 380 and the fourth memory cell 390.

The first memory cell 310, the second memory cell 320, the first switch circuit 330, the second switch circuit 340, the third switch circuit 350, the write driver 360, and the fourth switch circuit 370 may perform substantially the same functions as the first memory cell 210, the second memory cell 220, the first switch circuit 230, the second switch circuit 240, the third switch circuit 250, the write driver 260, and the fourth switch circuit 270 shown in FIG. 3, respectively.

The third memory cell 380 is connected to a second wordline WL2 and a first bit bar line BLB1. The third memory cell 380 may have the same function as the first memory cell 310. When an NMOS transistor of the third memory cell 380 is turned on, charge sharing may occur among the third memory cell 380, the first bit bar line BLB1, and the first bitline BL1. A voltage generated by the charge sharing may be used as a first reference voltage VREF1. A first reference voltage VREF1 generated by the third memory cell 380 and a first reference voltage VREF1 generated by the first memory cell 310 may be identical to each other.

The fourth memory cell 390 is connected to a second wordline WL2 and a second bit bar line BLB2. The fourth memory cell 390 may perform the same function as the second memory cell 320. When an NMOS transistor of the fourth memory cell 390 is turned on, charge sharing may occur among the fourth memory cell 390, the second bit bar line BLB2, and the second bitline BL2. A voltage generated by the charge sharing among the fourth memory cell 390, the second bit bar line BLB2, and the second bitline BL2 may be used as a second reference voltage VREF2. A second reference voltage generated by the fourth memory cell 390 and a second reference voltage VREF2 generated by the second memory cell 320 may be identical to each other.

Data stored in the first memory cell 310 and the second memory cell 320 may be used to determine data stored in a memory cell (not shown) connected to the first wordline WL1. Data stored in the third memory cell 380 and the fourth memory cell 390 may be used to determine data stored in a memory cell (not shown) connected to the second wordline WL2.

Figure 5:
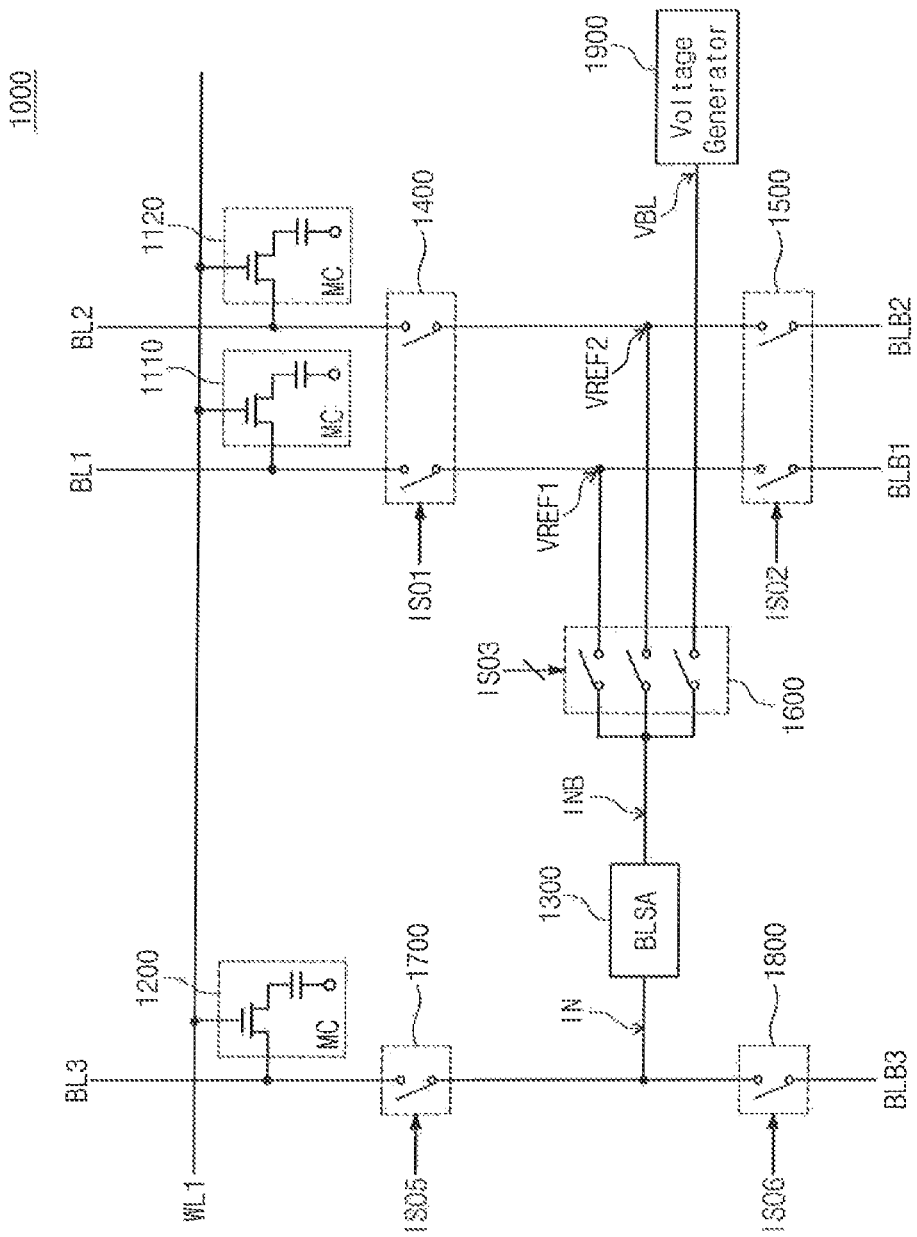
FIGS. 5 and 6 are block diagrams of memory devices according to exemplary embodiments of the inventive concepts, respectively.

FIG. 5 is a block diagram of a memory device 1000 according to an exemplary embodiment of the inventive concept. As illustrated, the memory device 1000 includes a first memory cell 1110, a second memory cell 1120, a third memory cell 1200, a bitline sense amplifier 1300, a first switch circuit 1400, a second switch circuit 1500, a third switch circuit 1600, a fifth switch circuit 1700, a sixth switch circuit 1800, and a voltage generator 1900. The first memory cell 1110, the second memory cell 1120, the first switch circuit 1400, and the second switch circuit 1500 are identical/similar to those described in FIG. 2 and will not be described in detail.

The third memory cell 1200 is connected to a first wordline WL1 and a third bitline BL3. The third memory cell 1200 may be implemented with the same structure as the first memory cell 1110 or the second memory cell 1120. Two or more bits of data may be stored in the third memory cell 1200.

For example, any one of data "00", "01", "10", and "11" may be stored in the third memory cell 1200. When data "11" is stored in the third memory cell 1200, a capacitor voltage of capacitor in the third memory cell 1200 is VINTA. When data "10" is stored in the third memory cell 1200, the capacitor voltage is ⅔*VINTA. When data "01" is stored in the third memory cell 1200, the capacitor voltage is assumed as ⅓*VINTA. When data "00" is stored in the third memory cell 1200, the capacitor voltage is GND (or 0*VINTA).

When the first wordline WL1 is applied with a high voltage (e.g., VPP), an NMOS transistor of the third memory cell 1200 is turned on. In this case, a third bitline BL3 and a third bit bar line BLB3 (not necessarily a complement of the third bitline BL3) are connected by the fifth switch circuit 1700 and the sixth switch circuit 1800 or may be connected beforehand. When the NMOS transistor of the third memory cell 1200 is turned on, charge sharing occurs among the third memory cell 1200, the third bitline BL3, and the third bit bar line BLB3.

As described above, a first reference voltage VREF1 may be generated by the sharing among the first memory cell 1110, the first bitline BL1, and the first bit bar line BLB1. A second reference voltage VREF2 may be generated by charge sharing among the second memory cell 1120, the second bitline BL2, and the second bit bar line BLB2. That is, the first reference voltage VREF1 and the second reference voltage VREF2 may be generated in a manner similar to charge sharing of the third memory cell 1200.

The bitline sense amplifier 1300 is configured to sense a difference between voltages at a first input node IN and a second input node INB to generate a sensing result and amplify the sensing result. The bitline sense amplifier 1300 may sense two or more bits of data stored in the third memory cell 1200. For example, the bitline sense amplifier 1300 may sense an MSB among data stored in the third memory cell 1200 and then sense a least significant bit (LSB). The configuration and operation of the bitline sense amplifier will be described in detail later with reference to FIG. 6.

Under the control of a third isolation signal ISO3, the third switch circuit 1600 may connect one of a first reference voltage line, a second voltage line, and a third voltage line to the second input node INB. A voltage at the second input node INB may be set to one of the first reference voltage VREF1, the second reference voltage VREF2, and a third reference voltage VBL.

The third reference voltage VBL may be used to sense an MSB of the third memory cell 1200. When the MSB is 1, the first reference voltage VREF1 may be used to sense an LSB of the third memory cell 1200. When the MSB is 0, the second reference voltage VREF2 may be used to sense an LSB of the third memory cell 1200.

As shown in FIG. 5, the third isolation signal ISO3 may be connected to three switches and each of the switches may be independently controlled by the third isolation signal ISO3. To achieve this, the third isolation signal ISO3 may be transmitted to the third switch circuit 1600 through a plurality of lines. The third isolation signal ISO3 may include MSB information. The third isolation signal ISO3 may be generated by a row decoder that will be described later with reference to FIG. 15.

Under the control of a fifth isolation signal ISO5, the fifth switch circuit 1700 connects the third bitline BL3 with the first input node IN. The fifth switch circuit 1700 is to be turned on during a charge sharing operation among the third memory cell 1200, the third bitline BL3, and the third bit bar line BLB3. When the bitline sense amplifier 1300 stores an MSB in the third bitline BL3, the fifth switch circuit 1700 is turned on. When the bitline sense amplifier 1300 stores an LSB in the third bit bar line BLB3, the fifth switch circuit 1700 is turned off. A fifth isolation signal ISO5 may be generated by the row decoder that will be described later with reference to FIG. 15.

As shown in FIG. 5, the fifth switch circuit 1700 includes only one switch. However, in the case that the memory device 1000 includes a plurality of memory cells (not shown), the fifth switch circuit 1700 may further include switches (not shown) respectively corresponding to the memory cells.

Under the control of a sixth isolation signal ISO6, the sixth switch circuit 1800 connects the third bit bar line BLB3 to the first input node IN. The sixth switch circuit 1800 is turned on during a charge sharing operation among the third memory cell 1200, the third bitline BL3, and the third bit bar line BLB3. When the bitline sense amplifier 1300 stores an MSB in the third bitline BL3, the sixth switch circuit 1800 is turned off. When the bitline sense amplifier 1300 stores an LSB in the third bit bar line BLB3, the sixth switch circuit 1800 is turned on. The sixth isolation signal ISO6 may be generated by the row decoder that will be described later with reference to FIG. 15.

As shown in FIG. 5, the sixth switch circuit 1800 includes only one switch. However, in the case that the memory device 1000 includes a plurality of memory cells (not shown), the sixth switch circuit 1800 may further include switches (not shown) respectively corresponding to the memory cells.

The voltage generator 1900 generates the third reference voltage VBL. The voltage generator 1900 may receive an external power supply (not shown) to generate the third reference voltage VBL. Although not shown in FIG. 5, the voltage generator 1900 may generate various power supplies required in the memory device 1000. In an embodiment, the third reference voltage VBL is VINTA/2. The VINTA may mean a highest voltage stored in a capacitor of the third memory cell 1200.

Figure 6:
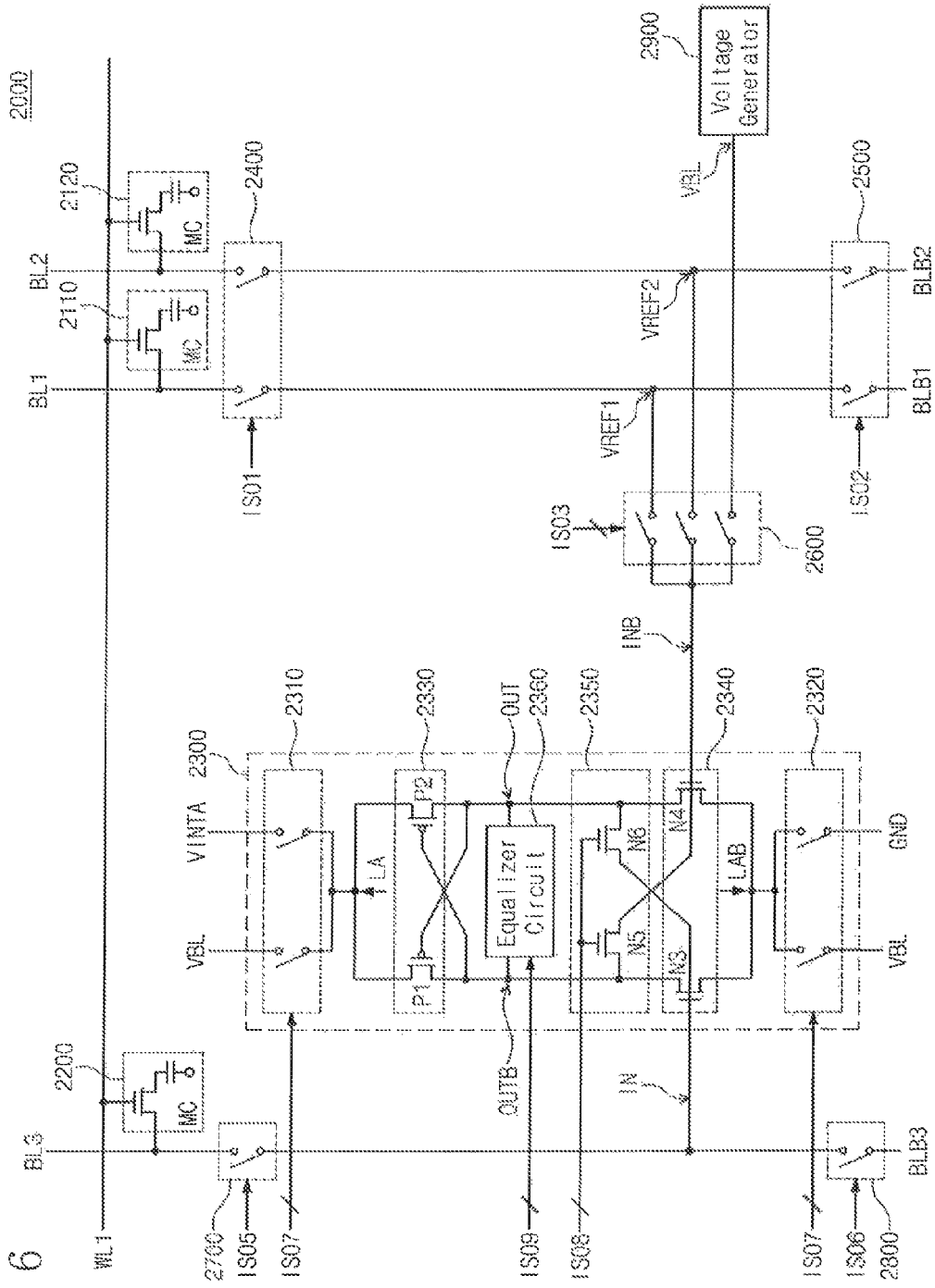

FIG. 6 is a block diagram of a memory device 2000 according to an exemplary embodiment of the inventive concept. As illustrated, the memory device 2000 includes a first memory cell 2110, a second memory cell 2120, a third memory cell 2200, a bitline sense amplifier 2300, a first switch circuit 2400, a second switch circuit 2500, a third switch circuit 2600, a fifth switch circuit 2700, a sixth switch circuit 2800, and a voltage generator 2900. The first memory cell 2110, the second memory cell 2120, the third memory cell 2200, the first switch circuit 2400, the second switch circuit 2500, the third switch circuit 2600, the fifth switch circuit 2700, the sixth circuit 2800, and the voltage generator 2900 are identical/similar to those described with reference to FIG. 5 and will not be described in detail.

The bitline sense amplifier 2300 includes a first power supply switch circuit 2310, a second power supply switch circuit 2320, an amplifier circuit 2330, a sensing circuit 2340, an input/output (I/O) connection circuit 2350, and an equalizer circuit 2360.

The first switch circuit 2310 connects one of a first node receiving voltage VBL and a second node receiving voltage VINTA to a first power supply node LA under the control of a seventh isolation signal ISO7. As mentioned above, the voltage VBL and the voltage VINTA may be generated by the voltage generator 2900. For example, the voltage VINTA may mean a maximum voltage stored in a capacitor of the third memory cell 2200 and the voltage VBL may be a voltage that is half a level of the voltage VINTA. When the first node receiving voltage VBL is connected to the first power supply node LA, the bitline sense amplifier 2300 does not operate. When the second node receiving voltage VINTA is connected to the first power supply node LA, the bitline sense amplifier 2300 performs a sensing operation. In this case, the memory device 2000 operates in an active mode. The first power supply switch circuit 2310 may include two switches. The switches of the first power supply switch circuit 2310 may be different from one another logically so that the seventh isolation signal ISO7 applied to both switches closes only one of the switches at a time.

The second power supply switch circuit 2320 connects one of a third node receiving the voltage VBL and a fourth node receiving the ground voltage GND to a second power supply node LAB under the control of the seventh isolation signal ISO7. When the third node receiving voltage VBL is connected to the second power supply node LAB, the bitline sense amplifier 2300 does not operate. In this case, the memory device 2000 operates in the precharge mode. When the fourth node receiving the ground voltage GND is connected to the second power supply node LAB, the bitline sense amplifier 2300 performs a sensing operation. In this case, the memory device 2000 operates in the active mode. The seventh isolation signal ISO7 may be generated by a row decoder that will be described later with reference to FIG. 15.

The second power supply switch circuit 2320 includes two switches. The switches of the second power supply switch circuit 2320 may be different from one another logically so that the seventh isolation signal ISO7 closes only one of the switches at a time. As shown in FIG. 6, the seventh isolation signal ISO7 may be connected to the two switches and each of the switches may be independently controlled by the seventh isolation signal ISO7. To achieve this, the seventh isolation signal ISO7 may be transmitted to the first power supply switch circuit 2310 and the second power supply switch circuit 2320 through a plurality of lines.

The amplifier circuit 2330 may include a first PMOS transistor P1 and a second PMOS transistor P2. The first PMOS transistor P1 is coupled between the first power supply node LA and a second output node OUTB. A gate of the first PMOS transistor P1 is connected to a first output node OUT. The second PMOS transistor P2 is coupled between the first power supply node LA and the first output node OUT. A gate of the second PMOS transistor P2 is connected to the second output node OUTB.

The amplifier circuit 2330 amplifies a difference between voltages at the first output node OUT and the second output node OUTB using positive feedback. For example, it is assumed that the voltage at the first output node OUT is slightly higher than the voltage at the second output node OUTB. Since a gate voltage of the first PMOS transistor P1, i.e., the voltage at the first output node OUT increases, the amount of current supplied to the second output node OUTB by the first PMOS transistor P1 decreases. Due to the decrease in the amount of the current, the voltage at the second output node OUTB decreases by a small amount. Since a gate voltage of the second PMOS transistor P2, i.e., the voltage at the second output node OUTB decreases, the amount of current supplied to the first output node OUT by the second PMOS transistor P2 increases by a small amount. Due to the increase in the amount of the current, a minute difference between the voltages at the first output node OUT and the second output node OUTB is gradually amplified by the foregoing positive feedback.

The sensing circuit 2340 may include a third NMOS transistor N3 and a fourth NMOS transistor N4. The third NMOS transistor N3 is coupled between the second power supply node LAB and the second output node OUTB. A gate of the third NMOS transistor N3 is connected to a first input node IN. The fourth NMOS transistor N4 is coupled between the second power supply node LAB and the first output node OUT. A gate of the fourth NMOS transistor N4 is connected to a second input node INB.

The sensing circuit 2340 senses a difference between voltages at the first input node IN and the second input node INB to generate a sensing result and transfers the sensing result to the amplifier circuit 2330. For example, it is assumed that the voltage at the first input node IN is a small amount higher than the voltage at the second input node INB. Since the gate voltage of the third NMOS transistor N3 increases a small amount, the amount of current discharged from the second output node OUTB by the third NMOS transistor N3 also increases a small amount. Thus, the voltage at the second output node OUTB decreases by a small amount as compared to the voltage at the first output node OUT. Then the small voltage difference is amplified by the amplifier circuit 2330.

The I/O connection circuit 2350 may include a fifth NMOS transistor N5 and a sixth NMOS transistor N6. The fifth NMOS transistor N5 is coupled between the second output node OUTB and the second input node INB. The sixth NMOS transistor N6 is coupled between the first output node OUT and the first input node IN. A gate of the fifth NMOS transistor N5 and a gate of the sixth NMOS transistor N6 is connected to an eighth isolation signal ISO8. The eighth isolation signal ISO8 may be generated by a row decoder that will be described later with reference to FIG. 15.

In the case that an MSB is stored in a third bitline BL3, the I/O connection circuit 2350 is turned on by the eighth isolation signal ISO8. In the case that an LSB is stored in third bit bar line BLB3, the I/O connection circuit 2350 is turned on by the eighth isolation signal ISO8. In the other cases, the I/O connection circuit 2350 may be turned off by the eighth isolation signal ISO8. Still referring to FIG. 6, the node receiving the eighth isolation signal ISO8 is connected to two switches and each of the switches may be independently controlled by the eight isolation signal ISO8. To achieve this, the eighth isolation signal ISO8 may be transmitted to the I/O connection circuit 2350 through a plurality of lines.

The equalizer circuit 2360 is configured to equalize the voltages at the first output node OUT and the second output node OUTB using a ninth isolation signal ISO9. The equalizer circuit 2360 may include switches (not shown) connecting the first output node OUT and the second output node OUTB to each other and switches (not shown) supplying a voltage to a connection point. For example, when the memory device 2000 operates in a precharge mode, the equalizer circuit 2360 may equalize the voltages at the first output node OUT and the second output node OUTB. In this case, each of the voltages may be set to voltage VBL. When the memory device 2000 operates in the active mode, the equalizer circuit 2360 isolates the first output node OUT and the second output node OUTB from each other.

Although not shown in FIG. 6, the ninth isolation signal ISO9 may be connected to a plurality of switches and each of the switches may be independently controlled by the ninth isolation signal ISO9. To achieve this, the ninth signal ISO9 may be transmitted to the equalizer circuit 2360 through the plurality of lines.

Figure 7:
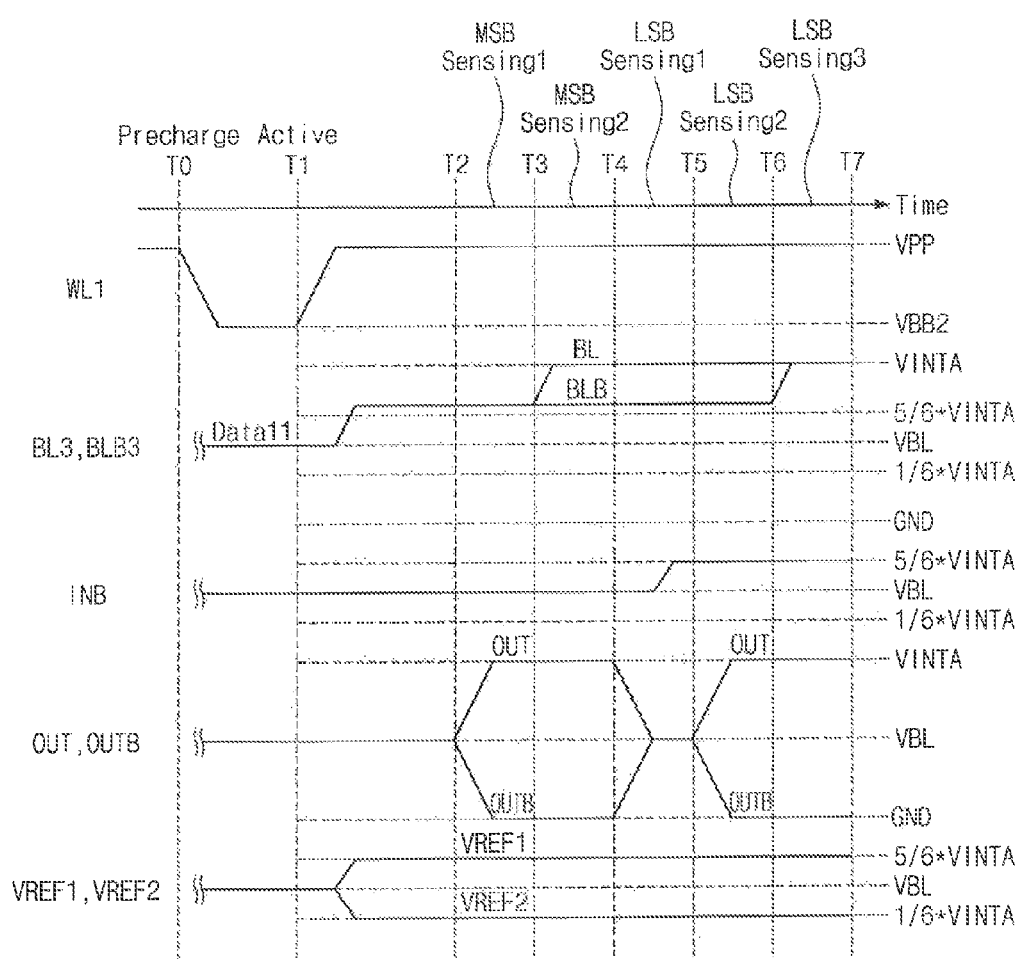
FIGS. 7 to 10 are timing diagrams illustrating operations of a memory device according to exemplary embodiments of the inventive concepts, respectively.

FIG. 7 is a timing diagram illustrating an operation of the memory device 2000 described with reference to FIG. 6. FIG. 7 will be described with reference to FIG. 6. FIG. 7 illustrates a process of sensing data "11" stored in the third memory cell 2200 when an active command is input to the memory device 2000 after a precharge command is input thereto. In this case, the MSB is "1" and the LSB is "1".

At a time point T0, a precharge command is input to the memory device 2000. A voltage of a first wordline WL1 changes from voltage VPP to voltage VBB2. The voltage VPP may be applied to the first wordline WL1 to activate the third memory cell 1200. The voltage VBB2 may be applied to the first wordline WL1 to deactivate the third memory cell 1200. At the time point T0, since the precharge command is input to the memory device 1000, the voltage of the first wordline WL1 changes from the voltage VPP to the voltage VBB2.

From the time point T0 to a time point T1, i.e., before the active command is input, a voltage of a third bitline BL3, a voltage of a third bit bar line BLB3, a first input node IN, a second input node INB, a first reference voltage VREF1, and a second reference voltage VREF2 are all set to voltage VBL. To achieve this, the first power supply switch circuit 2310 is connected to a node receiving the voltage VBL. The second power supply switch circuit 2320 may be connected to the node receiving the voltage VBL. The equalizer circuit 2360 may equalize the voltages at the first output node OUT and the second output node OUTB, and each of the voltages may be set to the voltage VBL.

At the time point T1, an active command is input to the memory device 2000. The voltage of the first wordline WL1 changes from the voltage VBB2 to the voltage VPP. Although not shown in FIG. 7, according to the active command, the fifth switch circuit 2700 is turned on by the fifth isolation signal ISO5 and the sixth switch circuit 2800 is turned on by the sixth isolation signal ISO6. After the voltage of the first wordline WL1 rises to the voltage VPP, charge sharing occurs among the third memory cell 2200, the third bitline BL3, and the third bit bar line BLB3. Since it was assumed that the data "11" is stored in the third memory cell 1200, charges stored in the third memory cell 1200 are transferred to the third bitline BL3 and the third bit bar line BLB3. For example, the voltage of the third bitline BL3 and the third bit bar line BLB3 may be raised higher than ⅝*VINTA.

Although not shown in FIG. 7, according to the active command at the time point T1, the first switch circuit 2400 is turned on by the first isolation signal ISO1. After the voltage of the first wordline WL1 rises to the voltage VPP, charge sharing occurs among the first memory cell 2110, the first bitline BL1, and the first bit bar line BLB1. After the voltage of the first wordline WL1 rises to the voltage VPP, charge sharing occurs among the second memory cell 2120, the second bitline BL2, and the second bit bar line BLB2. By the charge sharing, the first reference voltage VREF1 may be set to ⅝*VINTA and the second reference voltage VREF2 may be set to ⅛*VINTA. A capacitor voltage of a capacitor in the first memory cell 2110 may be ⅝*VINTA to set the first reference voltage VREF1. A capacitor voltage of a capacitor in the second memory cell 2120 may be ⅛*VINTA to set the second reference voltage VREF2. Each of the first and second reference voltages VREF1 and VREF2 may be used as a reference voltage of the bitline sense amplifier 2300.

At a time point T2, the MSB is sensed by the bitline sense amplifier 2300. Although not shown in FIG. 7, the sixth switch circuit 2800 is turned off by the sixth isolation signal ISO6. The voltage of the third bit bar line BLB3 may be used to sense the LSB, which will be described later. Although not shown in FIG. 7, by using the seventh isolation signal ISO7, the first power supply switch circuit 2310 may be connected to a node receiving voltage VINTA and the second power switch circuit 2320 may be connected to a node receiving the ground voltage GND. Since the bitline sense amplifier 2300 is applied with the power supplies VINTA and GND, a difference between the voltages at the first input node IN and the second input node INB is amplified by positive feedback. Still referring to FIG. 7, the voltage at the first input node IN may be higher than ⅝*VINTA. The voltage at the second input node INB may become set to the voltage VBL. Although not shown in FIG. 7, by using the third isolation signal ISO3, the third switch circuit 2600 may connect the second input node INB with the voltage generator 2900. At the time point T2, since the voltage at the first input node IN is higher than the voltage at the second input node INB, the first output node OUT is amplified to the VINTA and the second output node OUTB is amplified to the GND.

At a time point T3, the MSB sensed by the bitline sense amplifier 2300 is transferred to the third bitline BL3. By using the eighth isolation signal ISO8, the I/O connection circuit 2350 may connect the first output node OUT with the first input node IN. In this case, the fifth switch circuit 2700 is in a turn-on state and the sixth switch circuit 2800 is in a turn-off state. Thus, the voltage at the first output node OUT may be transferred to the third bitline BL3. Still referring to FIG. 7, the voltage at the third bitline BL3 rises to the voltage VINTA. Thus, the MSB "1" is stored in the third bitline BL3.

At a time point T4, the first output node OUT and the second output node OUTB are connected by the equalizer circuit 2360 to sense the LSB. By using the ninth isolation signal ISO9, the equalizer circuit 2360 connects the first output node OUT to the second output node OUTB. Still referring to FIG. 7, the voltage at each of the first and second output nodes OUT and OUTB becomes set to the voltage VBL. However, the voltage connected by the equalizer circuit 2360 is not limited to the voltage VBL.

At the time point T4, the voltage at the second input node INB rises from the voltage VBL to the first reference voltage VREF1, i.e., ⅝*VINTA. To achieve this, the third switch circuit 2600 connects the first reference voltage VREF1 and the second input node INB with each other by using the third isolation signal ISO3. Although not shown in the drawing, the third isolation signal ISO3 may include MSB information completed prior to the time point T4. When the MSB is sensed, the third switch circuit 2600 connects the second input node INB to a node receiving the voltage VBL by using the third isolation signal ISO3. When the LSB is sensed, the third switch circuit 2600 connects the second input node to one of a first node receiving the first reference voltage VREF1 and a second node receiving the second reference voltage VREF2 by using the third isolation single ISO3. When the MSB is "1", the second input node INB may be connected to the first node receiving the first reference voltage VREF1. When the MSB is "0", the second input node INB may be connected to the second node receiving the second reference voltage VREF2. Still referring to FIG. 7, since the MSB is "1", the voltage at the second input node INB is set to the first reference voltage VREF1. A time point to set the second input node INB to the first reference voltage VREF1 may be any time between the time points T4 and T5. That is, the setting time point is not limited to the time shown in FIG. 7.

At a time point T5, the LSB is sensed by the bitline sense amplifier 2300. Since the third bitline BL3 stores the MSB, the bitline sense amplifier 2300 needs to use the voltage of the third bit bar line BLB3. The fifth switch circuit 2700 is turned off by the fifth isolation signal ISO5. The sixth switch circuit 2800 is turned on by the sixth isolation signal ISO6. The voltage at the first input node IN is equalized to a voltage at the third bit bar line BLB3. The voltage at the first input node IN is higher than ⅝*VINTA. The voltage at the second input node INB is set to the first reference voltage VREF1 by the third switch circuit 2600.

At the time point T5, the difference between the voltages at the first and second input nodes IN and INB is amplified by positive feedback. Still referring to FIG. 7, since the voltage at the first input node IN is higher than the voltage at the second input node INB, the first output node OUT is amplified to the voltage VINTA and the second output node OUTB is amplified to the ground voltage GND.

At a time point T6, the LSB sensed by the bitline sense amplifier 2300 is transferred to the third bit bar line BLB3. The I/O connection circuit 2350 connects the first output node OUT with the first input node IN by using the eighth isolation signal ISO8. In this case, the fifth switch circuit 2700 is in a turn-off state and the sixth switch circuit 2800 is a turn-on state. Thus, the voltage at the first output node OUT is transmitted to the third bit bar line BLB3. Still referring to FIG. 7, the voltage at the third bit bar line BLB3 rises to the voltage VINTA. The LSB "1" is stored in the third bit bar line BLB3.

At a time point T7, the data "11" stored in the third memory cell 2200 has been sensed to store the MSB "1" in the third bitline BL3 and to store the LSB "1" in the third bit bar line BLB3. Following the time point T7, a read operation or a write operation may be performed on the memory device 2000.

Figure 8:
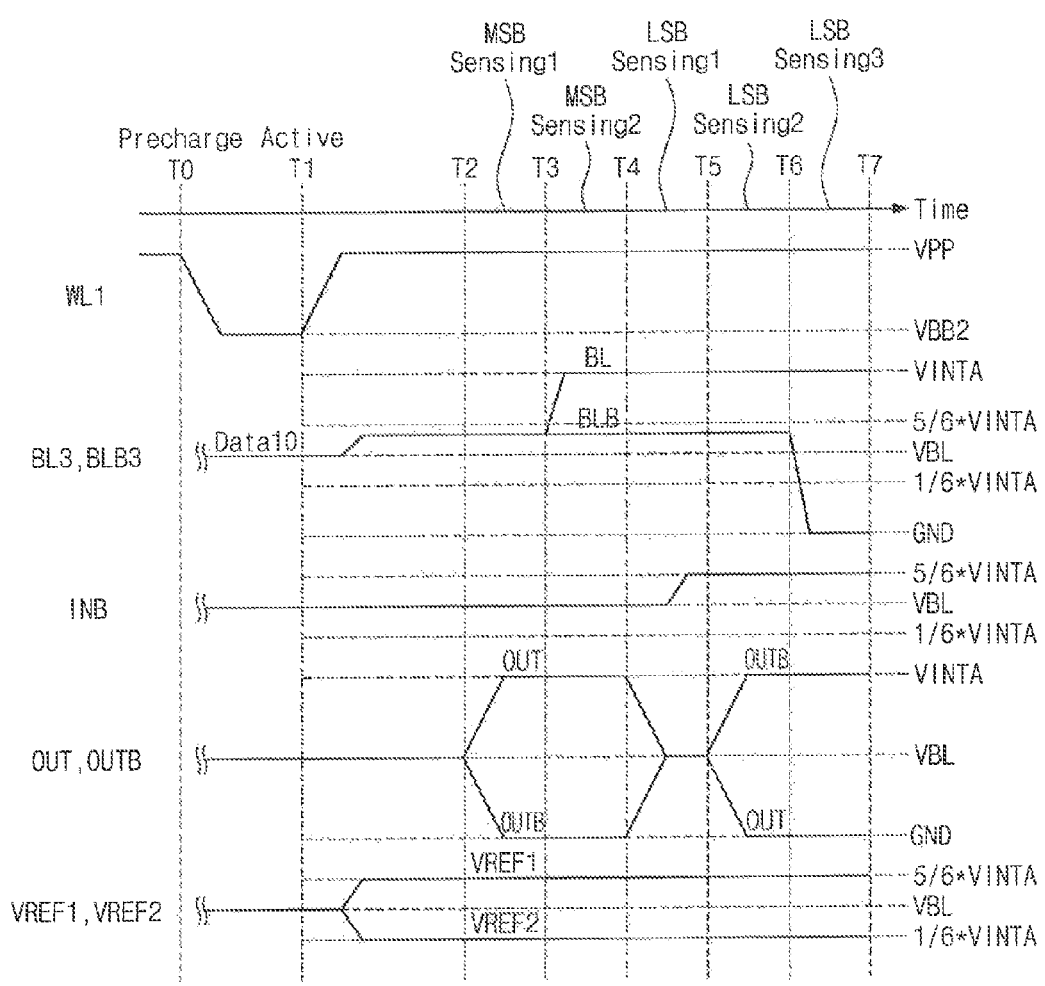

FIG. 8 is a timing diagram illustrating operation of the memory device 2000 described with reference to FIG. 6. FIG. 8 may be described with reference to FIGS. 6 and 7. FIG. 8 illustrates a process of activing data "10" stored in the third memory cell 2200 when an active command is input to the memory device 2000 after a precharge command is input thereto.

From a time point T0 to a time point T4, the operation of the memory device 2000 is roughly identical to that described in FIG. 7. However, since it is assumed that data "10" is stored in the third memory cell 2200, charges stored in a capacitor in the third memory cell 2200 are transferred to the third bitline BL3 and the third bit bar line BLB3. As a result, a voltage of the third bitline BL3 and the third bit bar line BLB3 are higher than VBL and lower than ⅚*VINTA. At the time point T4, a voltage of the third bitline BL3 rises to VINTA. An MSB "1" is stored in the third bitline BL3.

From the time point T4 to a time point T7, the operation of the memory device 2000 is roughly identical to that described in FIG. 7. However, at the time point T5, the voltage at the first input node IN is higher than the VBL and lower than ⅚*VINTA. The voltage at the second input node INB is set to a first reference voltage VREF1 by the third switch circuit 2600. A difference between the voltages at the first and second input nodes IN and INB is amplified by positive feedback. Since the voltage at the first input node IN is lower than the voltage at the second input node INB, the first output node OUT is amplified to GND and the second output node OUTB is amplified to VINTA. At the time point T7, the data "10" stored in the third memory cell 2200 is sensed to store an MSB "1" in the third bitline BL3 and to store an LSB "0" in the third bit bar line BLB3.

Figure 9:
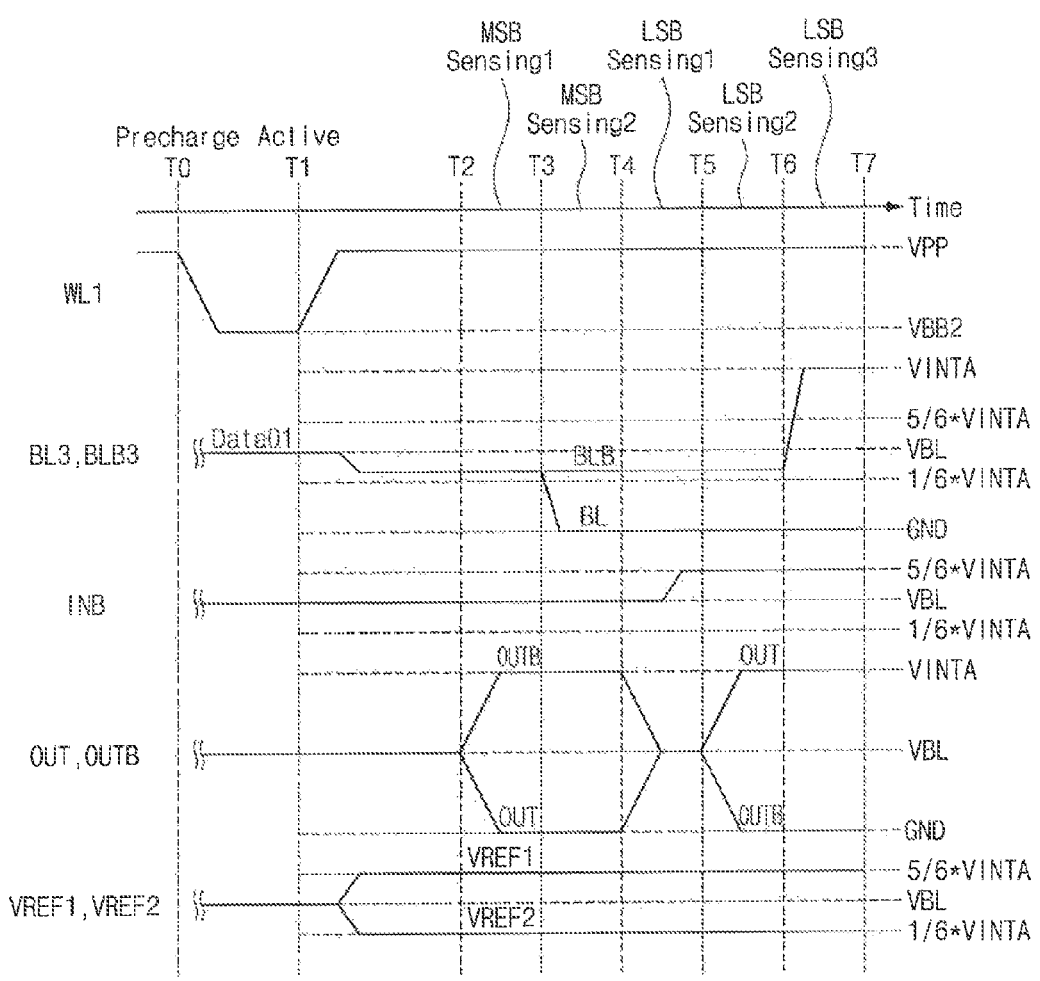

FIG. 9 is a timing diagram illustrating operation of the memory device 2000 described with reference to FIG. 6. FIG. 9 will be described with reference to FIGS. 6 and 7. FIG. 9 illustrates a process of activating data "01" stored in the third memory cell 2200 when an active command is input to the memory device 2000 after a precharge command is input thereto. From a time point T0 to a time point T4, the operation of the memory device 2000 is roughly identical that described in FIG. 7. However, since it is assumed that the data "01" is stored in the third memory cell 2200, charges stored in the third bitline BL3 and the third bit bar line BLB3 are transferred to a capacitor in the third memory cell 22s00. As a result, the voltage of the third bitline BL3 and the third bit bar line BLB3 is higher than ⅙*VINTA and lower than VBL. Since the voltage at the first input node IN is lower than the voltage at the second input node INB, the first output node OUT is amplified to GND and the second output node OUTB is amplified to VINTA. At the time T4, the voltage of the third bitline BL3 drops to the GND. An MSB "0" is stored in the third bitline BL3.

From the time point T4 to a time point T7, the operation of the memory device 2000 is roughly identical to that described in FIG. 7. However, at the time point T5, the voltage at the first input node IN is higher than ⅙*VINTA and lower than the VBL. Since the MSB is "0", the voltage at the second input node INB is set to the second reference voltage VREF2. The difference between the voltages at the first and second input node IN and the INB is amplified by positive feedback. Since the voltage at the first input node IN is higher than the voltage at the second input node INB, the first output node OUT is amplified to the VINTA and the second output node OUTB is amplified to the GND. An LSB "I" is stored in the third bitline BLB3. At the time point T7, the data "01" stored in the third memory cell 2200 is sensed to store the MSB "0" in the third bitline BL3 and to store the LSB "1" in the third bit bar line BLB3.

Figure 10:
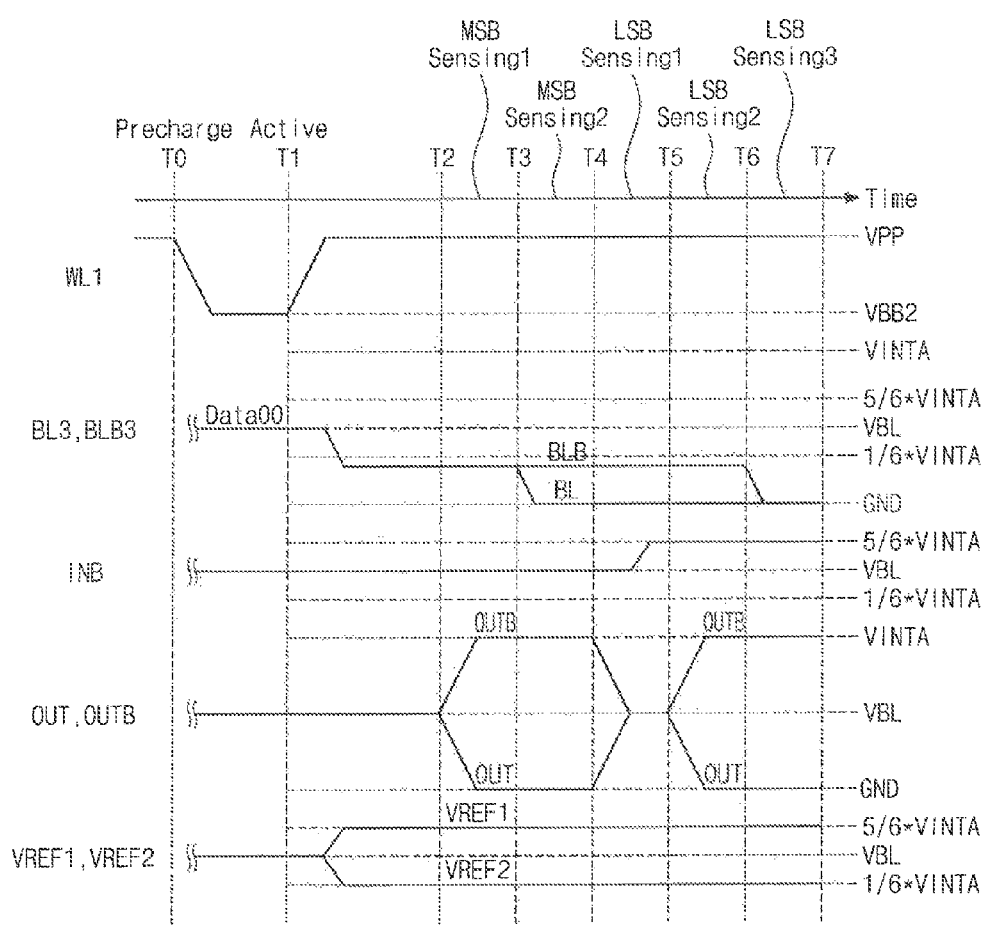

FIG. 10 is a timing diagram illustrating an operation of the memory device 2000 described with reference to FIG. 6. FIG. 10 will be described with reference to FIGS. 6 and 7. FIG. 10 illustrates a process of activating data "00" stored in the third memory cell 2200 when an active command is input to the memory device 2000 after a precharge command is input thereto.

At a time point T0 to a time point T4, the operation of the memory device 2000 is roughly identical to that described in FIG. 7. However, since it is assumed that data "00" is stored in the third memory cell 2200, charges stored in the third bitline BL3 and the third bit bar line BLB3 are transferred to a capacitor in the third memory cell 2200. As a result, the voltage of the third bitline BL3 and the third bit bar line BLB3 are lower than ⅙*VINTA. Since the voltage at the first input node IN is lower than the voltage at the second input node INB, the first output node OUT is amplified to GND and the second output node OUTB is amplified to VINTA. At the time point T4, the voltage of the third bitline BL3 drops to the GND. An MSB "0" is stored in the third bitline BL3.

At the time point T4 to a time point T7, the operation of the memory device 2000 is roughly identical to that described in FIG. 7. However, at the time point T5, the voltage at the first input node IN is lower than ⅙*VINTA. Since the MSB is "0", a voltage at the second input node INB is set to a second reference voltage VREF2. A difference between the voltages at the first input node IN and the second input node INB are amplified by positive feedback. Since the voltage at the first input node IN is lower than the voltage at the second input node INB, the first output node OUT is amplified to the GND and the second output node OUTB is amplified to the VINTA. An LSB "0" is stored in the third bit bar line BLB3. At the time point T7, the data "00" stored in the third memory cell 2200 is sensed to store the MSB "0" in the third bitline BL3 and to store the LSB "0" in the third bit bar line BLB3.

Figure 11:
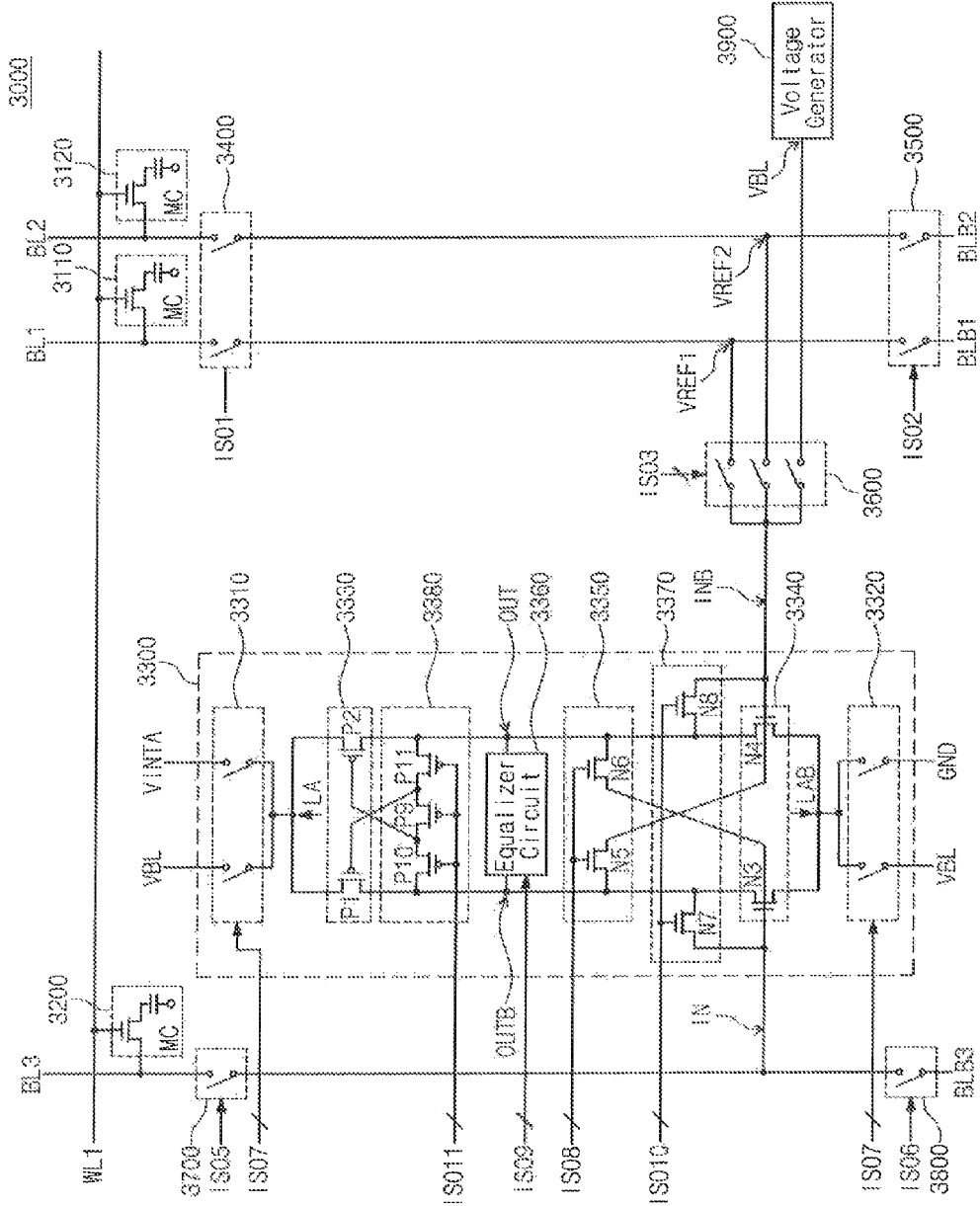
FIGS. 11 to 15 are block diagrams of memory devices according to exemplary embodiments of the inventive concepts, respectively.

FIG. 11 is a block diagram of a memory device 3000 according to an exemplary embodiment of the inventive concept. As illustrated, the memory device 3000 includes a first memory cell 3110, a second memory cell 3120, and a third memory cell 3200, a bitline sense amplifier 3300, a first switch circuit 3400, a second switch circuit 3500, a third switch circuit 3600, a fifth switch circuit 3700, a sixth switch circuit 3800, and a voltage generator 3900. The first memory cell 3110, the second memory cell 3120, the third memory cell 3200, the bitline sense amplifier 3300, the first switch circuit 3400, the second switch circuit 3500, the third switch circuit 3600, the fifth switch circuit 3700, the sixth switch circuit 3800, and the voltage generator 3900 are identical/similar to those described with reference to FIG. 6 and will not be described in detail.

The bitline sense amplifier 3300 includes a first power supply switch circuit 3310, a second power supply switch circuit 3320, an amplifier circuit 3330, a sensing circuit 3340, an input/output (I/O) connection circuit 3350, an equalizer circuit 3360, a buffer circuit 3370, and a mirroring circuit 3380. The first power supply switch circuit 3310, the second power supply switch circuit 3320, the amplifier circuit 3330, the sensing circuit 3340, the I/O connection circuit 3350, and the equalizer circuit 3360 are identical/similar to those described with reference to FIG. 6 and will not be described in detail. FIG. 11 will be described with reference to FIGS. 6 and 7.

The buffer circuit 3370 may include a seventh NMOS transistor N7 and an eighth NMOS transistor N8. The seventh NMOS transistor N7 is coupled between a second output node OUTB and a first input node IN. The eighth NMOS transistor N8 is coupled between a first output node OUT and a second input node INB. A gate of the seventh NMOS transistor N7 and a gate of the eighth NMOS transistor N8 are connected to a tenth isolation signal ISO10.

The tenth isolation signal ISO10 may be applied to two switches, and each of the switches may be independently controlled by the tenth isolation signal ISO10. To achieve this, the tenth isolation signal ISO10 may be transmitted to the buffer circuit 3370 through a plurality of lines. The tenth isolation signal ISO10 may be generated by a row decoder that will be described later with reference to FIG. 15.

The buffer circuit 3370 is operated by the tenth isolation signal ISO10 before charge sharing occurs between the third memory cell 3200, a third bitline BL3, and a third bit bar line BLB3. When the buffer circuit 3370 operates, the second output node OUTB and the first input node IN are connected to each other. In this case, the bitline sense amplifier 3300 operate as a unit gain buffer.

When the bitline sense amplifier 3300 operates as the unit gain buffer, an offset included in the first input node IN may be compensated. Since voltages at the first input node IN and the second output node OUTB are equalized by the bitline sense amplifier 3300, an offset of the first input node IN may be compensated. Offset compensation information may be stored in a third bitline BL3 and a third bit bar line BLB3. An offset may be caused by a mismatch between the third NMOS transistor N3 and the fourth NMOS transistor N4. For example, the mismatch may be caused by a difference in size, threshold voltage or pattern between the third NMOS transistor N3 and a fourth NMOS transistor N4 during fabrication.

The mirroring circuit 3380 may include a ninth PMOS transistor P9, a tenth PMOS transistor P10, and an eleventh PMOS transistor P11. The ninth PMOS transistor P9 is coupled between a gate of the first PMOS transistor P1 and a gate of the second PMOS transistor P2. The tenth PMOS transistor P10 is coupled between the second output node OUTB and the gate of the second PMOS transistor P2. The eleventh transistor P11 is coupled between the first output node OUT and the gate of the first PMOS transistor P1. A gate of each of the ninth, tenth, and eleventh PMOS transistors P9, P10, and P11 is connected to an eleventh isolation signal ISO11. Each of the ninth, tenth, and eleventh PMOS transistors P9, P10, and P11 may be independently controlled by the eleventh isolation signal ISO11.

Continuing to refer to FIG. 11, the eleventh isolation signal ISO11 may be applied to three switches and each of the switches may be independently controlled by the eleventh isolation signal ISO11. To achieve this, the eleventh isolation signal ISO11 may be transmitted to the mirroring circuit 3380 through a plurality of lines. The eleventh signal ISO11 may be generated by a row decoder that will be described later with reference to FIG. 15.

The offset compensation operation may be performed by the bitline sense amplifier 3300. To achieve this, the seventh NMOS transistor N7 is turned on by the tenth isolation signal ISO10, and the ninth PMOS transistor P9 and the eleventh PMOS transistor P11 are turned on and the tenth PMOS transistor P10 are turned off by the eleventh isolation signal ISO11. The offset compensation operation may be performed directly following the time point T1 (see FIG. 7). After an active command is input to the memory device 3000, an offset operation may be performed during a period (not shown) before a first wordline WL1 rises to VPP. The offset compensation operation may cause sensing performance of the bitline sense amplifier 3300 to be improved.

Figure 12:
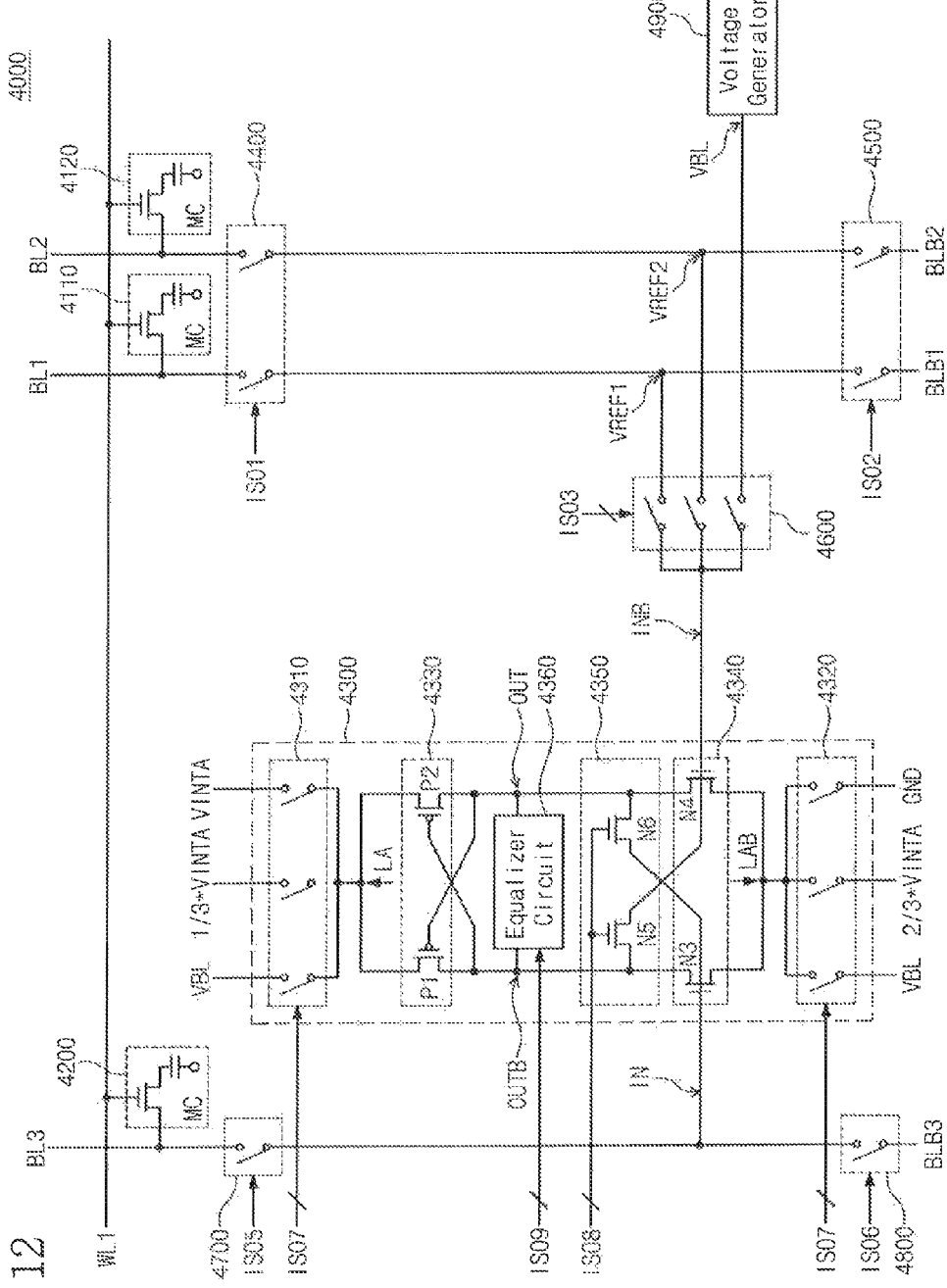

FIG. 12 is a block diagram of a memory device 4000 according to an exemplary embodiment of the inventive concept. As illustrated, the memory device 4000 includes a first memory cell 4110, a second memory cell 4120, a third memory cell 4200, a bitline sense amplifier 4300, a first switch circuit 4400, a second switch circuit 4500, a third switch circuit 4600, a fifth switch circuit 4700, a sixth switch circuit 4800, and a voltage generator 4900. The bitline sense amplifier 4300 includes a first power supply switch circuit 4310, a second power supply switch circuit 4320, an amplifier circuit 4330, a sensing circuit 4340, an input/output (I/O) connection circuit 4350, and an equalizer circuit 4360. Except for the first power supply switch circuit 4310 and the second power supply switch circuit 4320, the other components in the memory device 4000 performs the same functions as corresponding components in the memory device 2000 in FIG. 6, respectively.

Unlike the first power supply switch circuit 2310 in FIG. 6, the first power supply switch circuit 4310 connect one of a first node receiving VBL, a second node receiving ⅓*VINTA, and a third node receiving VINTA to a first power supply node LA for a restore operation. Unlike the second power supply switch circuit 2320 in FIG. 6, the second power supply switch circuit 4320 connects one of a fourth node receiving VBL, a fifth node receiving ⅔*VINTA, and a sixth node receiving GND to a second power supply node LAB for the restore operation. The term "restore operation" means an operation to restore data in the third memory cell 4200. The restore operation may be performed after a read operation or a write operation on the memory device 4000 has completed.

For the restore operation, the fifth switch circuit 4700 connects a third bitline BL3 to a first input node IN. The sixth switch circuit 4800 does not connect a third bit bar line BLB3 with the first input node IN. The I/O connection circuit 4350 connects a first output node OUT to the first input node IN. Thus, a voltage at the first output node OUT is transferred to a capacitor of the third memory cell 4200.

For example, when data "11" is stored in the third memory cell 4200, the first power supply switch circuit 4310 connects a node receiving VINTA to the first power supply node LA. The second power supply switch circuit 4320 connects a node receiving ⅔*VINTA to the second power supply node LAB. To achieve this, a seventh isolation signal ISO7 may include MSB information. Since a voltage at the first output node OUT is the VINTA and the voltage at the second output node OUTB is GND, MSB information previously stored in the first output node OUT and the second output node OUTB (see FIG. 7). By using the first power supply switch circuit 4310 and the second power supply switch circuit 4320, the voltage at the first output node OUT is set to the VINTA and the voltage at the second output node OUTB is set to the ⅔*VINTA. Since the voltage at the first output node OUT is transferred to the capacitor of the third memory cell 4200, a capacitor voltage is set to the VINTA. The VINTA may correspond to the data "11".

For example, when data "10" is stored in the third memory cell 4200, the data "11" is identical to the MSB. Therefore, the first power supply node LA becomes VINTA and the second power supply node LAB becomes ⅔*VINTA. Since the voltage at the first output node OUT is GND and the voltage at the second output node OUTB is VINTA, MSB information previously stored in the first output node OUT and the second output node OUTB (see FIG. 8). By using the first power supply switch circuit 4310 and the second power supply switch circuit 4320, the voltage at the first output node OUT is set to ⅔*VINTA and the voltage at the second output node OUTB is set to VINTA. Since the voltage at the first output node OUT is transferred to the capacitor of the third memory cell 4200, a capacitor voltage is set to ⅔*VINTA. The ⅔*VINTA may correspond to the data "10".

For example, when data "01" is stored in the third memory cell 4200, the first power supply switch circuit 4310 connects a node receiving ⅓*VINTA to the first power supply node LA. The second power supply switch node 4320 connects the node receiving the GND to the second power supply node LAB. The first power supply node LA becomes ⅓*VINTA, and the second power supply node LAB becomes GND. Since the voltage at the first output node OUT is VINTA and the voltage at the second output node OUTB is GND, the LSB information is previously stored in the first output node OUT and the second output node OUTB (see FIG. 9). By using the first power supply switch circuit 4310 and the second power supply switch circuit 4320, the voltage at the first output node OUT is set to ⅓*VINTA and the voltage at the second output node OUTB is set to GND. Since the voltage at the first output node OUT is transferred to the capacitor of the third memory cell 4200, the capacitor voltage is set to ⅓*VINTA. The ⅓*VINTA may correspond to the data "01".

For example, when data "00" is stored in the third memory cell 4200, the data "01" is identical to an MSB. Therefore, the first power supply node LA becomes ⅓*VINTA and the second power supply node LAB becomes GND. Since the voltage at the first output node OUT is GND and the voltage at the second output node is VINTA, MSB information previously stored in the first output node OUT and the second output node OUTB (see FIG. 10). By using the first power supply switch circuit 4310 and the second power supply switch circuit 4320, the voltage at the first output node OUT is set to GND and the voltage at the second output node OUTB is set to ⅓*VINTA. Since the voltage at the first output node OUT is transferred to the capacitor of the third memory cell 4200, the capacitor voltage is set to GND. The GND may correspond to the data "00".

The memory device 4000 changes a power supply of the bitline sense amplifier 4300 according to the MSB and the LSB stored in the third memory cell 4200. The memory device 4000 may perform a restore operation on the third memory cell 4200 through the power supply of the bitline sense amplifier 4300. Although not shown in FIG. 12, the bitline sense amplifier 4300 may further include a buffer circuit 3370 (see FIG. 11) and a mirroring circuit 3380 (see FIG. 11).

Figure 13:
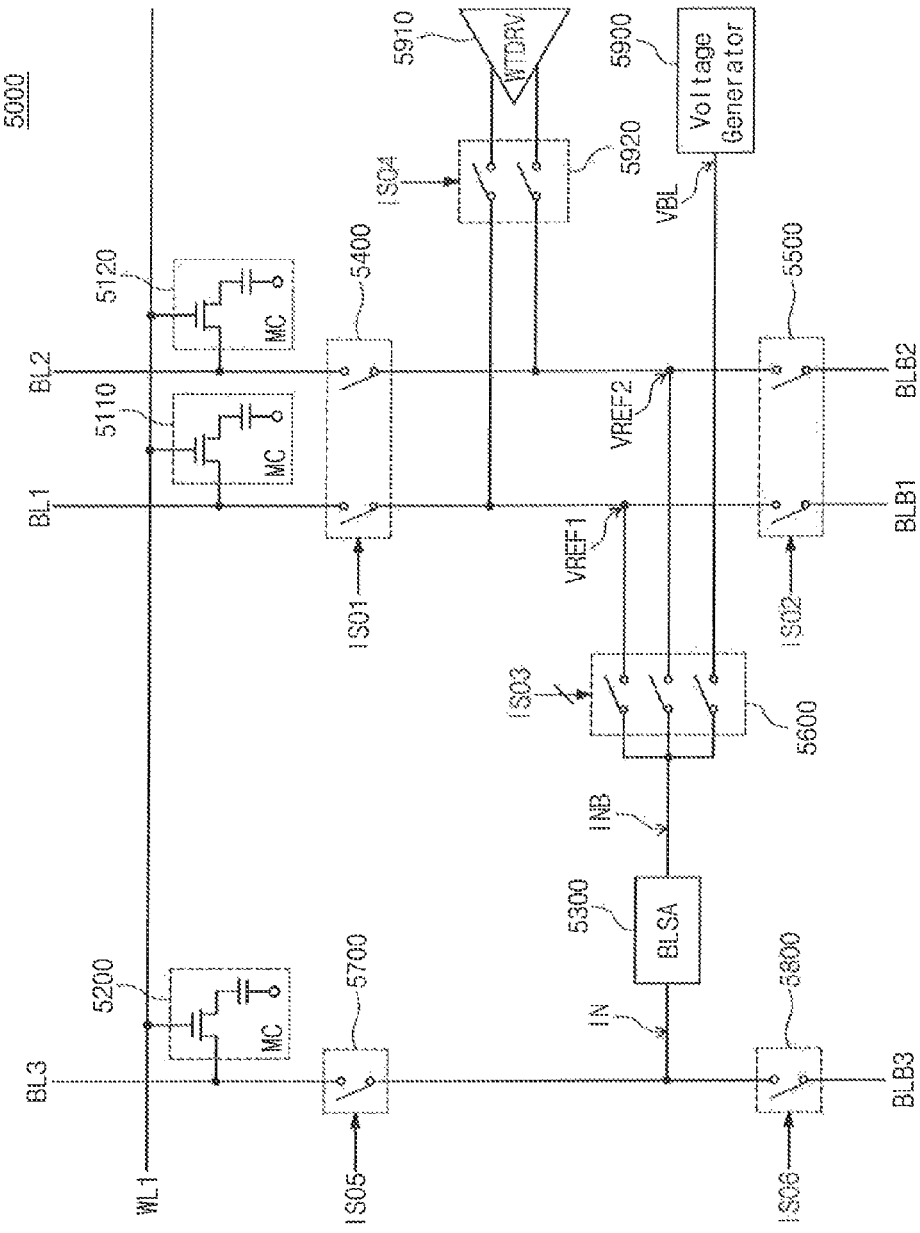

FIG. 13 is a block diagram of a memory device 5000 according to an exemplary embodiment of the inventive concept. As illustrated, the memory device 5000 includes a first memory cell 5110, a second memory cell 5120, a third memory cell 5200, a bitline sense amplifier 5300, a first switch circuit 5400, a second switch circuit 5500, a third switch circuit 5600, a fourth switch circuit 5920, a fifth switch circuit 5700, a sixth switch circuit 5800, a voltage generator 5900, and a write driver 5910. Except for the fourth switch circuit 5920 and the write driver 5910 in the memory device 5000, the other components perform the same functions as corresponding components in the memory device 4000 in FIG. 12, respectively. The fourth switch circuit 5920 and the write driver 5910 perform the same functions as the fourth switch circuit 270 and the write driver 260 in FIG. 3, respectively.

Figure 14:
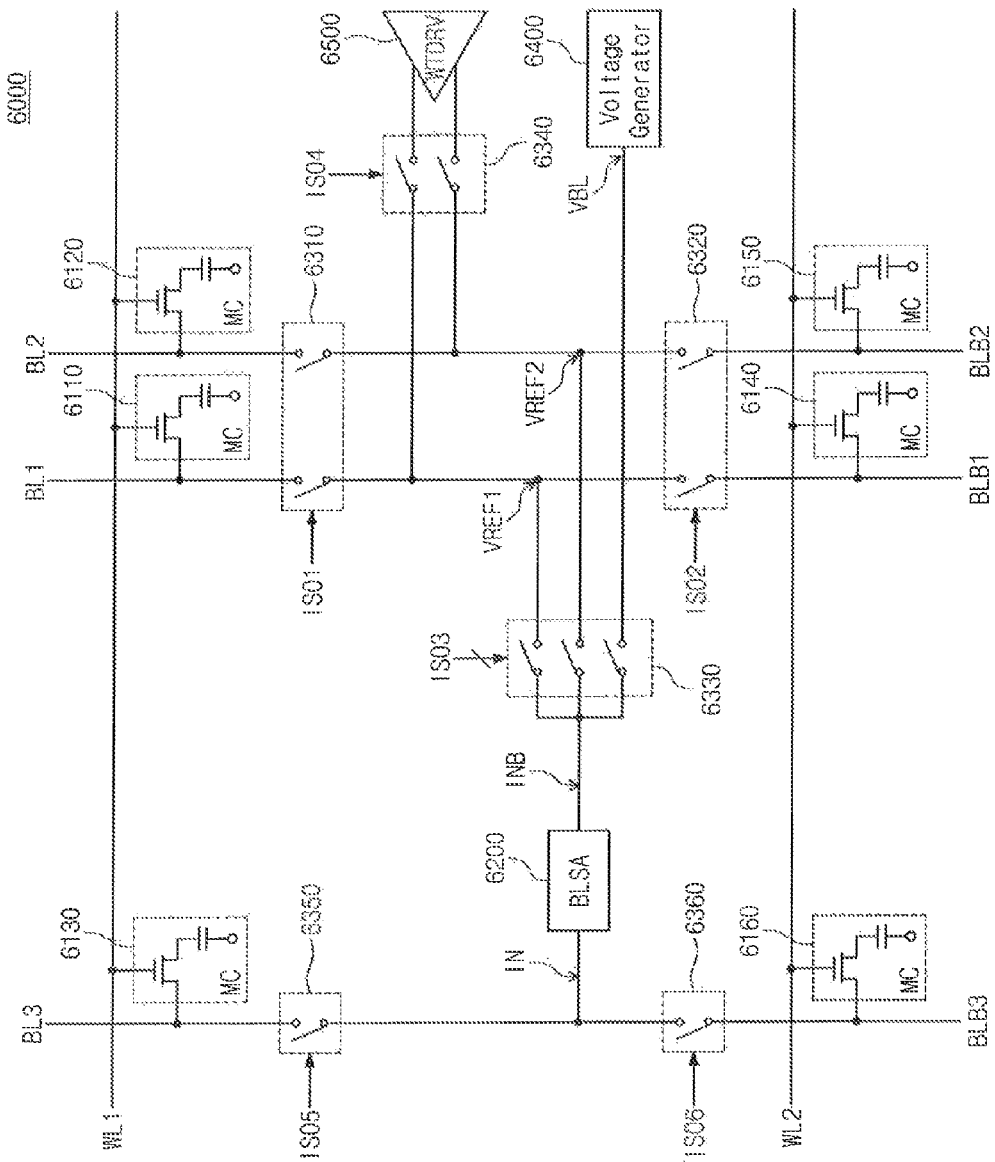

FIG. 14 is a block diagram of a memory device 6000 according to an exemplary embodiment of the inventive concept. As illustrated, the memory device 6000 includes a first memory cell 6110, a second memory cell 6120, a third memory cell 6130, a fourth memory cell 6140, a fifth memory cell 6150, a sixth memory cell 6160, a bitline sense amplifier 6200, a first switch circuit 6310, a second switch circuit 6320, a third switch circuit 6330, a fourth switch circuit 6340, a fifth switch circuit 6350, a sixth switch circuit 6360, a voltage generator 6400, and a write driver 6500. Except for the fourth memory cell 6140, the fifth memory cell 6150, and the sixth memory cell 6160 in the memory cell 6000, the other components perform the same functions as corresponding components in the memory device 5000 in FIG. 13, respectively. The fourth memory cell 6140 and the fifth memory cell 6150 are identical/similar to those described with reference to FIG. 4 and will not be described in detail.

The sixth memory cell 6160 may be implemented with the same structure as the third memory cell 6130. The memory device 6000 includes the fourth memory cell 6140 and the fifth memory cell 6150 to sense data stored in the sixth memory cell 6160.

Figure 15:
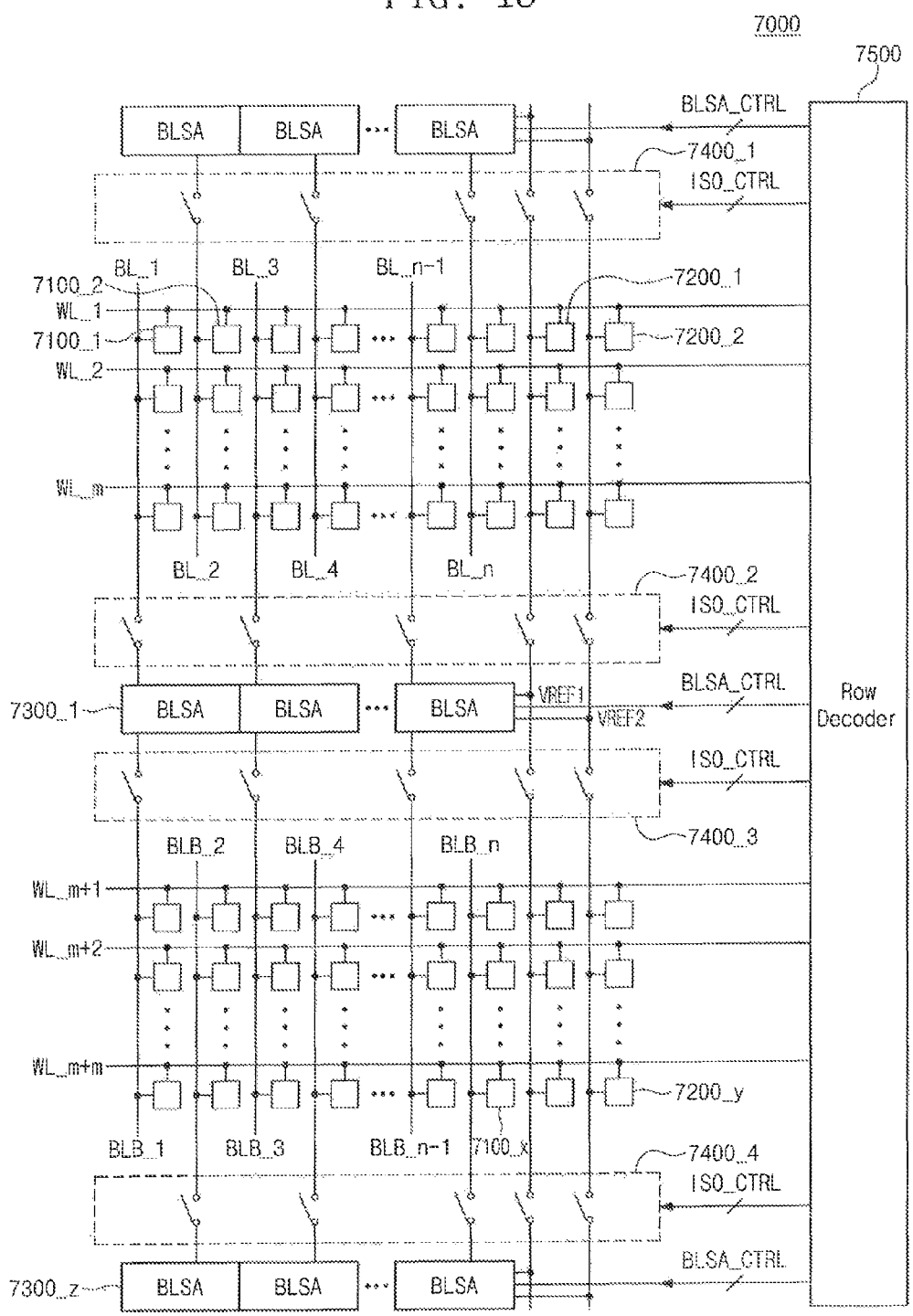

FIG. 15 is a block diagram of a memory device 7000 according to an exemplary embodiment of the inventive concept. As illustrated, the memory device 7000 includes a plurality of first memory cells 7100_1 to 7100_x, a plurality of second memory cells 7200_1 to 7200_y, a plurality of bitline sense amplifiers 7300_1 to 7300_z, switch circuits 7400_1 to 7400_4, and a row decoder 7500. Although each of the memory devices illustrated in FIGS. 5 and 6 and FIGS. 11 to 14 includes one or two memory cells, exemplary embodiments of the inventive concepts may also be applied to a case where a memory device includes two or more memory cells.

Referring to FIG. 15, the memory device 7000 includes a plurality of wordlines WL_1 to WL_m and WL_m+1 to WL_m+m and a plurality of bitlines BL_1 to BL_n. However, exemplary embodiments of inventive concepts are not limited thereto. The memory device 7000 may further include a plurality of wordlines and a plurality of bitlines and may further include a plurality of sense amplifiers corresponding to the plurality of wordlines and the plurality of bitlines. Memory cells may be arranged at intersections of the plurality of wordlines and the plurality of bitlines.

The second memory cells 7200_1 to 7200_y may be disposed to the right of the first memory cells 7100_1 to 7100_x. The memory device 7000 may include the second memory cells 7200_1 to 7200_y as well as the first memory cells 7100_1 to 7100_x. Dummy memory cells adjacent to the first memory cells 7100_1 to 7100_x may be needed to enhance productivity of the first memory cells 7100_1 to 7100_x. The second memory cells 7200_1 to 7200_y may be the dummy memory cells or may be separately implemented. The memory device 7000 may use the second memory cells 7200_1 to 7200_y to generate a first reference voltage VREF1 and a second reference voltage VREF2. Although not shown in FIG. 15, the second memory cells 7200_1 to 7200_y may be disposed in the center or to the left of the first memory cells 7100_1 to 7100_x.

The first memory cells 7100_1 to 7100_x may be affected by process, voltage, and temperature (PVT) variation or noise. Performance such as a sensing margin of the first memory cells 7100_1 to 7100_x may be affected by the PVT variation or the noise. Since the second memory cells 7200_1 to 7200_y are disposed adjacent to the first memory cells 7100_1 to 7100_x, the second memory cells 7200_1 to 7200_y may be affected by PVT variation or noise similar to that of the first memory cells 7100_1 to 7100_x. Thus, the first reference voltage VREF1 and the second reference voltage VREF2 may also be affected by PVT variation or noise similar to that of the first memory cells 7100_1 to 7100_x.

The second memory cells 7200_1 and 7200_2 may be activated by the first wordline WL_1 at the same time when the first memory cell 7100_1 is activated. The first reference voltage VREF1 and the second reference voltage VREF2 generated by the second memory cells 7200_1 and 7200_2 may be transferred to the bitline sense amplifier 7300_1. The bitline sense amplifier 7300_1 may sense data stored in the first memory cell 7100_1. Data stored in the other memory cells 7100_2 to 7100_x may be sensed in the same way.

The switches 7400_1 to 7400_4 may include a first switch circuit 6310 (see FIG. 14), a second switch circuit 6320 (see FIG. 14), a fifth switch circuit 6350 (see FIG. 14) or a sixth switch circuit 6360 (see FIG. 14).

The row decoder 7500 may select at least one of the wordlines WL_1 to WL_m and WL_m+1 to WL_m+m. The row decoder 7500 may generate signals BLSA_CTRL and ISO_CTRL to control the bitline sense amplifiers 7300_1 to 7300_z and the switch circuits 7400_1 to 7400_4. The row decoder 7500 may control bitline sense amplifiers and switch circuits disposed adjacent to a selected wordline.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A memory device comprising:
a first memory cell connected to a first wordline and a first bitline;
a second memory cell connected to the first wordline and a second bitline;
a third memory cell connected to the first wordline and a third bitline;
a bitline sense amplifier having a first input node and a second input node, the first input node connected to the third bitline; and
a switch circuit configured to connect the first bitline and the second bitline to the second input node,
wherein a first reference voltage is generated by charge sharing between the first memory cell and the first bitline, a second reference voltage is generated by charge sharing between the second memory cell and the second bitline, and charge sharing occurs among the third bitline and a third bit bar line by way of the first input node during sensing of a plurality of data bits stored in the third memory cell.

2. The memory device as set forth in claim 1, wherein the switch circuit outputs the first reference voltage and the second reference voltage to the bitline sense amplifier.

3. The memory device as set forth in claim 2, wherein the switch circuit comprises:
a first switch circuit configured to connect the first bitline to a first reference voltage line and to connect the second bitline to a second reference voltage line;
a second switch circuit configured to connect a first bit bar line to the first reference voltage line and to connect a second bit bar line to the second reference voltage line; and
a third switch circuit configured to output one of the first reference voltage and the second reference voltage to the bitline sense amplifier.

4. The memory device as set forth in claim 3, wherein the first reference voltage is generated by charge sharing among the first memory cell, the first bitline, and the first bit bar line, and the second reference voltage is generated by charge sharing among the second memory cell, the second bitline, and the second bit bar line.

5. The memory device as set forth in claim 3, further comprising:
a fourth memory cell connected to a second wordline and the first bit bar line; and
a fifth memory cell connected to the second wordline and the second bit bar line.

6. The memory device as set forth in claim 5, wherein the first reference voltage is generated by charge sharing among the first memory cell, the first bitline, and the first bit bar line or charge sharing among the fourth memory cell, the first bit bar line, and the first bitline, and the second reference voltage is generated by charge sharing among the second memory cell, the second bitline, and the second bit bar line or charge sharing among the fifth memory cell, the second bit bar line, and the second bitline.

7. The memory device as set forth in claim 3, further comprising:
a write driver configured to provide voltages to be respectively stored in the first memory cell and the second memory cell; and
a fourth switch circuit configured to connect the write driver to each of the first and second reference voltage lines.

8. The memory device as set forth in claim 2, wherein the bitline sense amplifier senses a difference between voltages at the first input node and the second input node to generate a sensing result and amplifies the sensing result for output to a first output node and a second output node.

9. The memory device as set forth in claim 8, further comprising:
a fifth switch circuit configured to connect the third bitline to the first input node;
a sixth switch circuit configured to connect the third bit bar line to the first input node; and
a voltage generator connected to a third reference voltage line and configured to generate a third reference voltage,
wherein a third switch circuit connects one of the first, second, and third reference voltage lines to the second input node.

10. The memory device as set forth in claim 9, wherein the bitline sense amplifier comprises:

a first power supply switch circuit configured to receive the third reference voltage in a precharge mode and to receive a driving voltage higher than the third reference voltage in an active mode;

a second power supply switch circuit configured to receive the third reference voltage in the precharge mode and to receive a driving voltage lower than the third reference voltage in the active mode;

an amplifier circuit including a first p-channel metal oxide semiconductor (PMOS) transistor coupled between the first power supply switch circuit and the second output node and a second PMOS transistor coupled between the first power supply switch circuit and the first output node, wherein a gate of the first PMOS transistor is connected to the first output node and a gate of the second PMOS transistor is connected to the second output node;

a sensing circuit including a third n-channel metal oxide semiconductor (NMOS) transistor coupled between the second power supply switch circuit and the second output node and a fourth NMOS transistor coupled between the second power supply switch circuit and the first output node, wherein a gate of the third NMOS transistor is connected to the first input node and a gate of the fourth NMOS transistor is connected to the second input node;

an input/output connection circuit including a fifth NMOS transistor coupled between the first output node and the first input node and a sixth NMOS transistor coupled between the second output node and the second input node; and an equalizer circuit configured to connect the first output node to the second output node.

11. The memory device as set forth in claim 10, wherein the bitline sense amplifier further comprises:
   a buffer circuit including a seventh NMOS transistor coupled between the first input node and the second output node and an eighth NMOS transistor coupled between the second input node and the first output node; and
   a mirroring circuit including a ninth PMOS transistor coupled between the gate of the first PMOS transistor and the gate of the second PMOS transistor, a tenth PMOS transistor coupled between the gate of the second PMOS transistor and the second output node, and an eleventh PMOS transistor coupled between the gate of the first PMOS transistor and the first output node.

12. A memory device comprising:
   a reference voltage generation circuit comprising a first memory cell coupled between a first wordline and a first bitline and a second memory cell coupled between the first wordline and a second bitline; a third memory cell connected to the first wordline and a third bitline; and
   a bitline sense amplifier having a first input node connected to the third bitline and a second input node connected to the reference voltage generation circuit, wherein the reference voltage generation circuit generates a first reference voltage by performing charge sharing between the first memory cell and the first bitline, generates a second reference voltage by performing charge sharing between the second memory cell and the second bitline and charge sharing occurs among the third bit line, and a third bit bar line by way of the first input node when the bitline sense amplifier senses a plurality of data bits stored in the third memory cell.

13. The memory device as set forth in claim 12, wherein the reference voltage generation circuit transfers the first reference voltage and the second reference voltage to the bitline sense amplifier.

14. The memory device as set forth in claim 13, wherein the reference voltage generation circuit further comprises:
   a fourth memory cell connected to a second wordline and a first bit bar line; and
   a fifth memory cell connected to the second wordline and a second bit bar line.

15. The memory device as set forth in claim 14, wherein the first reference voltage is generated by charge sharing among the first memory cell, the first bitline, and the first bit bar line or charge sharing among the fourth memory cell, the first bit bar line, and the first bitline, and the second reference voltage is generated by charge sharing among the second memory cell, the second bitline, and the second bit bar line or charge sharing among the fifth memory cell, the second bit bar line, and the second bitline.

16. A memory device comprising:
   a controller configured to generate a first control signal and a second control signal;
   a first memory cell connected to a first wordline and a first bitline;
   a second memory cell connected to the first wordline and a second bitline;
   a third memory cell connected to the first wordline and a third bitline;
   a bitline sense amplifier having a first input node connected to the third bitline and a third bit bar line, and a second input node connected to the first bitline and the second bitline;
   a first switch circuit configured to connect the first bitline to a first reference voltage line and the second bitline to a second reference voltage line in response to the first control signal; and
   a second switch circuit configured to connect one of the first and second reference voltage lines to the bitline sense amplifier in response to the second control signal, wherein charge sharing occurs among the third bit line, and the third bit bar line by way of the first input node during sensing of a plurality of data bits stored in the third memory cell.

17. The memory device of claim 16, further comprising a third switch circuit configured to connect a first bit bar line to the first reference voltage line and connect a second bit bar line to the second reference voltage line in response to a third control signal generated by the controller.

18. The memory device of claim 16, wherein the controller is a row decoder.

19. The memory device of claim 16, wherein the bitline sense amplifier is configured to sense a difference between a voltage on the third bitline and a voltage output by the second switch circuit and amplify the difference.

20. The memory device of claim 16, further comprising a voltage generator outputting a voltage providing information on a most significant bit to the second switch circuit.

* * * * *